(12) United States Patent
Watakabe et al.

(10) Patent No.: US 12,505,796 B2
(45) Date of Patent: Dec. 23, 2025

(54) DISPLAY DEVICE

(71) Applicant: Magnolia White Corporation, Tokyo (JP)

(72) Inventors: Hajime Watakabe, Tokyo (JP); Kentaro Miura, Tokyo (JP); Masashi Tsubuku, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 0 days.

(21) Appl. No.: 18/104,300

(22) Filed: Feb. 1, 2023

(65) Prior Publication Data

US 2023/0169922 A1 Jun. 1, 2023

Related U.S. Application Data

(63) Continuation of application No. PCT/JP2021/026300, filed on Jul. 13, 2021.

(30) Foreign Application Priority Data

Aug. 7, 2020 (JP) ................................. 2020-135399

(51) Int. Cl.
*G09G 3/3233* (2016.01)
*H10K 59/131* (2023.01)
*H10K 59/80* (2023.01)

(52) U.S. Cl.
CPC ......... *G09G 3/3233* (2013.01); *H10K 59/131* (2023.02); *H10K 59/8731* (2023.02)

(58) Field of Classification Search
CPC .................................................... G09G 3/3233
See application file for complete search history.

(56) References Cited

U.S. PATENT DOCUMENTS

2013/0299819 A1   11/2013   Yamazaki et al.
2017/0005669 A1    1/2017   Fujita
(Continued)

FOREIGN PATENT DOCUMENTS

JP        2009200528 A  *  9/2009  ............ H01L 27/12
JP        2013-254950 A    12/2013
(Continued)

OTHER PUBLICATIONS

English translation of JP 2019186273 A (Year: 2019).*
(Continued)

*Primary Examiner* — Lixi C Simpson
(74) *Attorney, Agent, or Firm* — XSENSUS LLP

(57) ABSTRACT

A display device including a substrate, a light-emitting element, a first transistor, and a second transistor, the first transistor including the first gate electrode on the substrate; a first insulating film on the first gate electrode, a first oxide semiconductor on the first insulating film, and having an area overlapping the first gate electrode, a second insulating film on the first oxide semiconductor, and a first conductive layer on the second insulating film, the second transistor including the first insulating film on the substrate, a second oxide semiconductor on the first insulating film, a second insulating film on the first oxide semiconductor and the second oxide semiconductor, and having a thickness smaller than a thickness of the first insulating film, a second gate electrode on the second insulating film, and having an area overlapping the second oxide semiconductor.

5 Claims, 25 Drawing Sheets

(56) References Cited

U.S. PATENT DOCUMENTS

2018/0061908 A1* 3/2018 Shim ............... H10K 59/00
2021/0020662 A1* 1/2021 Ishida ............... G09G 3/3258

FOREIGN PATENT DOCUMENTS

| JP | 2017-17683 A | | 1/2017 |
|----|----|----|----|
| JP | 2019117835 A | | 7/2019 |
| JP | 2019186273 A | * | 10/2019 |
| JP | 2020-12971 A | | 1/2020 |
| JP | 2020012971 A | | 1/2020 |
| WO | 2019/130915 A1 | | 7/2019 |
| WO | 2019187139 A1 | | 10/2019 |

OTHER PUBLICATIONS

Translation of JP-2009200528-A (Year: 2009).*
International Search Report and Written Opinion mailed on Sep. 21, 2021, received for PCT Application PCT/JP2021/026300, filed on Jul. 13, 2021, 11 pages including English Translation.
English machine translation of Office Action dated Jul. 16, 2024 issued in JP Appl. No. 2020-135399, 4pp.
English machine translation of Office Action dated May 5, 2025 issued in KR Appl. No. 10-2023-7003020, 10pp.
English machine translation of Chinese Office Action issued Dec. 21, 2024, in corresponding Chinese Patent Application No. 202180057008.X, 7pp.

* cited by examiner

DISPLAY DEVICE

CROSS-REFERENCE TO RELATED APPLICATIONS

This application is a Continuation of International Patent Application No. PCT/JP2021/026300, filed on Jul. 13, 2021, which claims the benefit of priority to Japanese Patent Application No. 2020-135399, filed on Aug. 7, 2020, the entire contents of each are incorporated herein by reference.

FIELD

An embodiment of the present invention relates to a display device. In particular, it relates to a structure of pixels of the display device.

BACKGROUND

An organic electroluminescence (hereinafter, referred to as an organic EL) display device has been actively studied because of its advantages such as high viewing angle, high-speed response, and usability as a sheet display. A light-emitting element is arranged for each pixel of the organic EL display device, and an image is displayed by individually controlling light emission. The light-emitting element has a structure in which a layer (hereinafter, also referred to as "light-emitting layer") including an organic EL material is sandwiched between a pair of electrodes distinguished from each other by one being an anode and the other being a cathode. When an electron is injected into the light-emitting layer from the cathode and a positive hole is injected from the anode, the electron and the positive hole recombine with each other. The extra energy released thereby excites light-emitting molecules in the light-emitting layer and then de-excites them to emit light.

In recent years, an oxide semiconductor (Oxide Semiconductor; OS) has attracted attention as a semiconductor layer constituting an organic EL display device. A transistor using the oxide semiconductor layer is expected to be applied to a low-power display device because of low off-leakage current and low-frequency driving. In particular, power consumption is greatly reduced by applying a transistor using the oxide semiconductor layer to a self-luminous organic EL display device (Japanese laid-open Patent Publication No. 2013-254950).

SUMMARY

A display device according to an embodiment of the present invention includes a substrate, a light-emitting element, a first transistor controlling a current value flowing from a driving power supply line to the light-emitting element, and a second transistor writing a voltage determining a luminance of the light-emitting element to a first gate electrode of the first transistor, the first transistor including the first gate electrode arranged on the substrate; a first insulating film arranged on the first gate electrode, a first oxide semiconductor arranged on the first insulating film, and having an area overlapping the first gate electrode, a second insulating film arranged on the first oxide semiconductor, and a first conductive layer arranged on the second insulating film, the second transistor including the first insulating film arranged on the substrate, a second oxide semiconductor arranged on the first insulating film, a second insulating film arranged on the first oxide semiconductor and the second oxide semiconductor, and having a thickness smaller than a thickness of the first insulating film, a second gate electrode arranged on the second insulating film, and having an area overlapping the second oxide semiconductor, wherein the first conductive layer is electrically connected to the light-emitting element.

A display device according to an embodiment of the present invention includes a substrate, a light-emitting element, a first transistor controlling a current value flowing from a driving power supply line to the light-emitting element, and a second transistor writing a voltage determining a luminance of the light-emitting element to a first gate electrode of the first transistor, the first transistor including a first gate electrode arranged on the substrate, a first insulating film arranged on the first gate electrode, and a first oxide semiconductor arranged on the first insulating film, and overlapping the first gate electrode, the second transistor including: the first insulating film arranged on the substrate, a second oxide semiconductor arranged on the first insulating film, a second insulating film arranged on the first oxide semiconductor and the second oxide semiconductor, and having a thickness smaller than a thickness of the first insulating film, a second gate electrode arranged on the second insulating film, and having an area overlapping the second oxide semiconductor, wherein the first oxide semiconductor has a first channel area and a low concentration impurity area arranged across the first channel area and a first high concentration impurity area arranged adjacent to the low concentration impurity area, and the second oxide semiconductor layer has a second channel area and a second high concentration impurity area arranged across the second channel area.

DESCRIPTION OF EMBODIMENTS

A transistor using an oxide semiconductor layer has a problem of low reliability, such as a change in threshold voltage over time. In the case where the transistor using the oxide semiconductor layer is formed in a bottom gate structure or a dual gate structure, it is difficult to ensure sufficient reliability.

In an embodiment of the present invention, the reliability of a display device is improved.

Hereinafter, embodiments of the present invention will be described with reference to the drawings and the like. However, the present invention can be implemented in various forms without departing from the gist of the present invention, and is not to be construed as being limited to the description of the embodiments illustrated below. In addition, in order to make the description clearer with respect to the drawings, the width, thickness, shape, and the like of each part may be schematically represented in comparison with actual embodiments, but the schematic drawings are merely examples, and do not limit the interpretation of the present invention. Further, in the present specification and the drawings, the same or similar elements as those described with respect to the above-described drawings are denoted by the same symbols, and redundant description may be omitted.

In the present invention, in the case where a single film is processed to form a plurality of films, the plurality of films may have different functions and roles. However, the plurality of films are derived from films formed as the same layer in the same process, and have the same layer structure and the same material. Therefore, the plurality of films is defined as being present in the same layer.

Further, in the present specification, expressions such as "above" and "below" in describing the drawings represent relative positional relationships between a structure of interest and another structure. In the present specification, in a side view, a direction from a first substrate to a pixel electrode, which will be described later, is defined as "above", and a reverse direction thereof is defined as "below". In this specification and claims, the expression "on" in describing the manner of arranging another structure on a certain structure shall include both arranging another structure directly above a certain structure and arranging another structure over a certain structure via yet another structure, unless otherwise specified.

First Embodiment

A display device 100 according to an embodiment of the present invention will be described with reference to FIG. 1 to FIG. 9.

Figure 1:
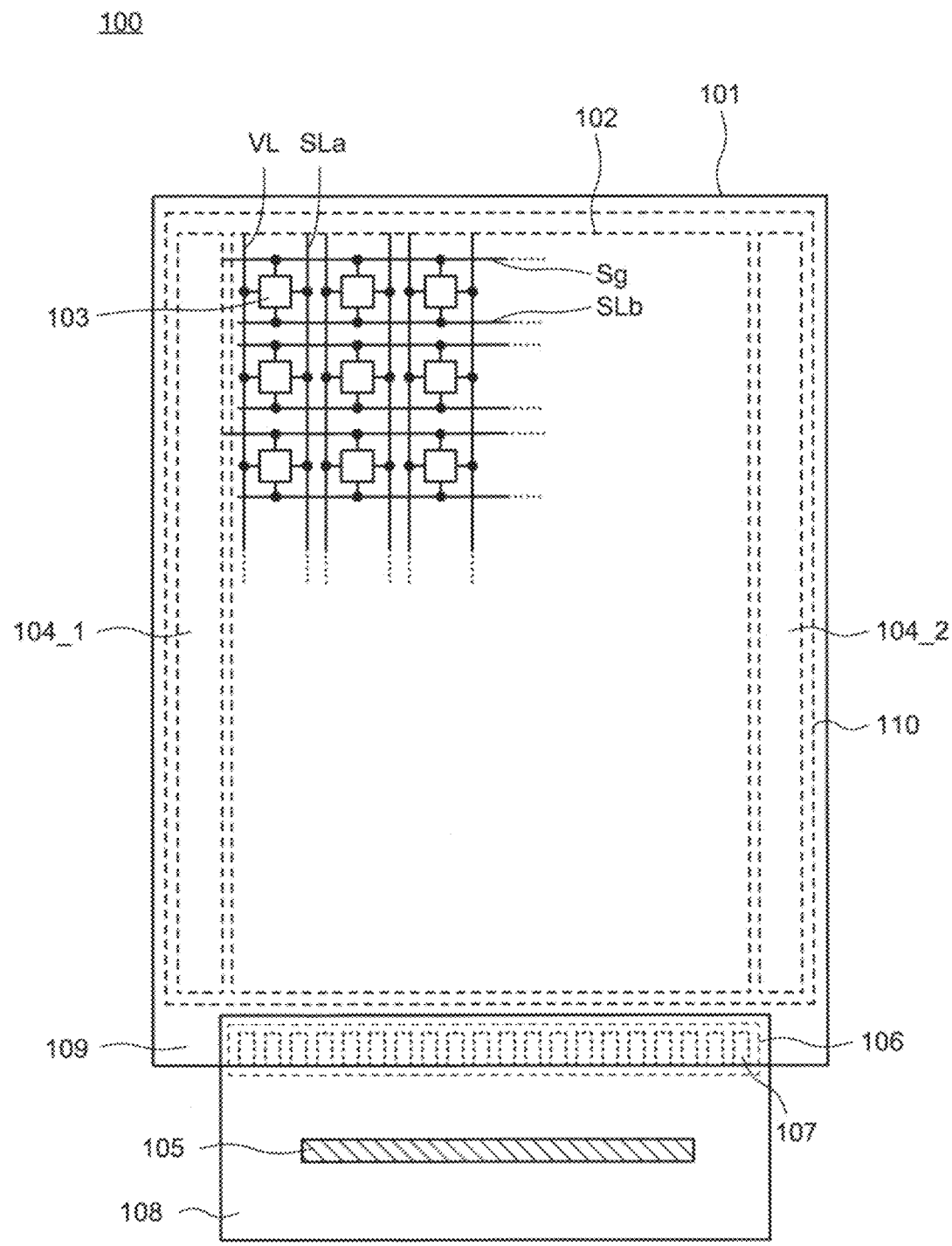
FIG. 1 is a plan view illustrating a structure of a display device according to an embodiment of the present invention.

FIG. 1 is a plan view illustrating a structure of a display device according to an embodiment of the present invention. As shown in FIG. 1, the display device 100 includes a display area 102 and a peripheral area 109 arranged on a substrate 101.

The display area 102 includes a plurality of pixels 103 arranged in a matrix. Each of the plurality of pixels 103 includes a plurality of transistors and light-emitting elements.

The peripheral area 109 is arranged to surround the display area 102. The peripheral area 109 in the substrate 101 refers to an area from the display area 102 to an end portion of the substrate 101. In other words, the peripheral area 109 refers to the substrate 101 that is not arranged with the display area 102 (i.e., an area outside the display area 102). The peripheral area 109 includes gate driving circuits 104_1 and 104_2, a terminal portion 107 including a plurality of terminals 106, and a driver IC 105. The gate driving circuits 104_1 and 104_2 are arranged so as to sandwich the display area 102. The driver IC 105 is connected to the plurality of terminals 106, and the plurality of terminals 106 is connected to a flexible printed circuit 108. In FIG. 1, although an example is shown in which the driver IC 105 includes a source driving circuit, it is not limited to this structure, and a source driving circuit may be arranged separately from the driver IC 105 on the substrate 101. In addition, although an example in which the driver IC 105 is arranged in the substrate 101 in the form of an IC tip is shown, it is not limited to this structure and may be arranged in the flexible printed circuit 108.

The driver IC 105 is connected to the gate driving circuits 104_1 and 104_2 and a plurality of video signal lines VL. The gate driving circuit 104_1 or the gate driving circuit 104_2 is connected to the pixel 103 via a write control scanning line Sg. Among the plurality of write control scanning lines Sg, for example, the write control scanning line Sg in an odd-numbered row is connected to the gate driving circuit 104_1 and the write control scanning line Sg in an even-numbered row is connected to the gate driving circuit 104_2. The video signal line VL is connected to the pixel 103. A control signal SG for selecting each pixel 103 is applied to the display area 102 from the driver IC 105 via the gate driving circuits 104_1 and 104_2 and the write control scanning line Sg. In addition, a video signal Vsig is applied to the display area 102 from the driver IC 105 via the video signal line VL. With these signals, the transistors included in the pixel 103 can be driven, and an image corresponding to the video signal Vsig can be displayed on the display area 102. In addition, each of a high potential power source SLa and a low potential power source electrode SLb connected to the pixel 103 is connected to different terminals 106.

A glass substrate or a flexible plastic substrate is used as the substrate 101. If a flexible plastic substrate is used as the substrate 101, an area between the display area 102 and the terminal portion 107 can be folded. This makes it possible to reduce the frame size of the display device 100.

<Equivalent Circuit Diagram>

Figure 2:
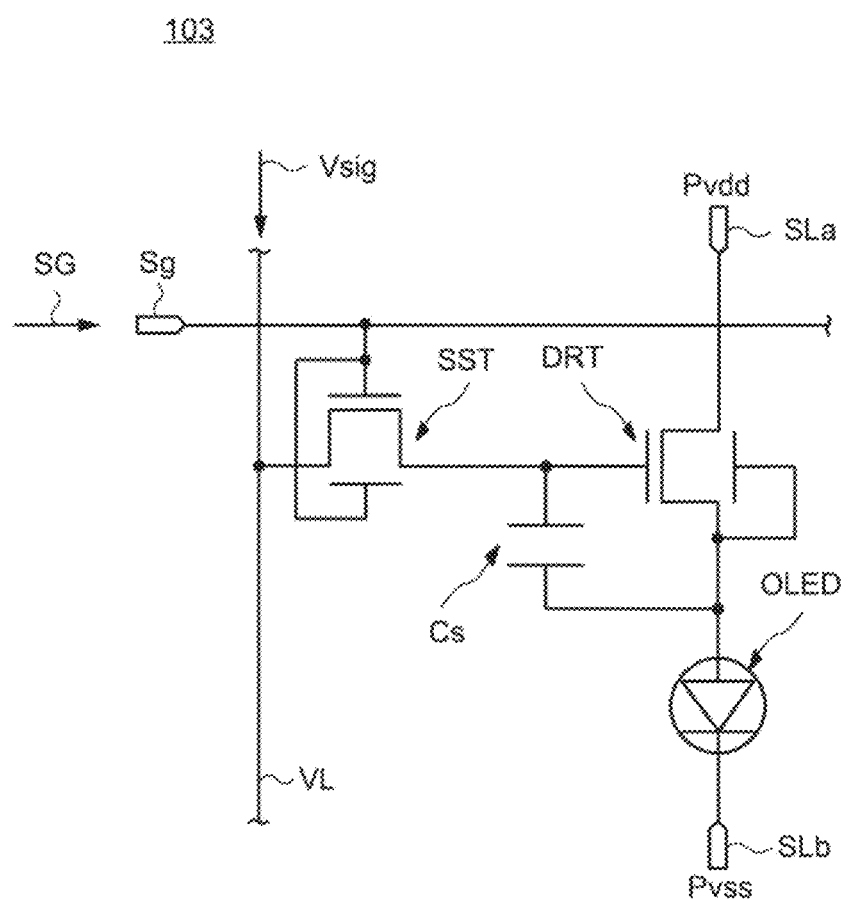
FIG. 2 is an equivalent circuit diagram of a pixel included in a display device according to an embodiment of the present invention.

FIG. 2 is an equivalent circuit diagram of the pixel 103 included in the display device 100 according to an exemplary embodiment. The display device 100 has the high potential power source SLa, the low potential power source electrode SLb, the write control scanning line Sg, and the video signal line VL. A high potential power source Pvdd is applied to the high potential power source SLa, and a low potential power source Pvss is applied to the low potential power source electrode SLb. The write control scanning line Sg is connected to the gate driving circuits 104_1 and 104_2, and the video signal line VL is connected to the driver IC 105.

Each pixel 103 includes at least a driving transistor DRT, a writing transistor SST, and a light-emitting element OLED. The high potential power source Pvdd is applied to an anode (also referred to as a pixel electrode) of the light-emitting element OLED and a low potential power source Pvss is applied to the cathode (also referred to as a common electrode) via the driving transistor DRT. The driving transistor DRT is connected in series with the light-emitting element OLED between the high potential power source SLa and the low potential power source electrode SLb. The driving transistor DRT functions as a current control element that controls a current flowing through the light-emitting element OLED according to a gate-source voltage. The writing transistor SST functions as a switching element that selects conduction or non-conduction between two nodes, and writes a voltage corresponding to the emission luminance of the light-emitting element OLED. A holding capacity Cs may be arranged between the gate-source of the driving transistor DRT. The holding capacity Cs holds the gate-source voltage of the driving transistor DRT for a certain period.

The writing transistor SST includes a first terminal, a second terminal, and a control terminal. The driving transistor DRT includes a first terminal, a second terminal, a first control terminal, and a second control terminal. In the present embodiment, the first terminal is referred to as a source electrode, the second terminal is referred to as a drain electrode, the first control terminal is referred to as a first gate electrode, and the second control terminal is referred to as a second gate electrode.

In the writing transistor SST, the first gate electrode and the second gate electrode are connected to the write control scanning line Sg, the source electrode is connected to the video signal line VL, and the drain electrode is connected to the first gate electrode of the driving transistor DRT. In the driving transistor DRT, the drain electrode is connected to the high potential power source SLa, and the source electrode is connected to one of the electrodes (in this case, the anode) of the second gate electrode and the light-emitting element OLED. The other electrode (in this case, the cathode) of the light-emitting element OLED is connected to the low potential power source electrode SLb. The driving transistor DRT outputs a driving current with a current amount corresponding to the video signal Vsig to the light-emitting element OLED.

For example, amorphous silicon, low-temperature polysilicon, or an oxide semiconductor is used as the semiconductor layer of the transistor constituting the display device 100. In this case, since the transistor using the oxide semiconductor layer has a low off-leakage current and can be driven at a low frequency, the display device 100 with low power consumption can be realized. In addition, the transistor using the oxide semiconductor layer has a better saturating property than a transistor including a low-temperature polysilicon layer because the kink effect is not observed. In the present embodiment, the case where the oxide semiconductor layer is used as the semiconductor layer of the transistor constituting the display device 100 will be described.

A transistor using the oxide semiconductor layer has a problem of low reliability, such as a change in threshold voltage over time. For example, in the case where the writing transistor and the driving transistor are formed with a dual gate structure to increase an ON current of the transistor using the oxide semiconductor layer, a voltage applied to the oxide semiconductor layer is likely to be applied to the driving transistor, and a large amount of current flows through the driving transistor. As a result, thermal degradation occurs in the oxide semiconductor layer, and the reliability of the driving transistor is reduced.

In the case where the transistor using the oxide semiconductor layer is formed with a top gate structure, a gate insulating film is formed to have a thin thickness of 100 nm or more and 200 nm or less. As a result, the ON current of the transistor can be increased, and a subthreshold swing value (hereinafter, referred to as "S value") can be reduced. Therefore, in the case where the transistor with the top gate structure is used as the writing transistor, an effect can be obtained whereby the switching characteristic is improved due to a small S value. On the other hand, in the case where the transistor with the top gate structure is used as the driving transistor, current driving is performed, and therefore, a change in current becomes large due to a small S value. In particular, in a low gradation area that needs to be controlled with a minute current, the change in the current of the driving transistor becomes large, so that it becomes impossible to finely control the gradation. As a result, display unevenness is likely to occur in the display area 102.

In addition, in the case where the transistor using the oxide semiconductor layer is formed with the bottom gate structure, the thickness of the gate insulating film is increased, which makes it difficult to apply a voltage applied to the oxide semiconductor layer, so that the current flowing through the transistor can be reduced. Therefore, in the case where the transistor with the bottom gate structure having a thick gate insulating film is used as the driving transistor, thermal degradation to the oxide semiconductor layer is suppressed, and the reliability of the transistor is improved. On the other hand, in the case where the transistor with the bottom gate structure having a thick gate insulating film is used as the writing transistor, an ON current Ion of the writing transistor tends to decrease due to the thick gate insulating film.

Therefore, in the case where the transistor using the oxide semiconductor layer is applied to a display device, it is preferred to arrange a transistor having various properties and structures depending on a required function. For example, a transistor having good switching characteristics and high ON current is preferably arranged in the writing transistor, and a transistor having lower switching characteristics than that of the writing transistor and suppressed thermal deterioration and high reliability is preferably arranged in the driving transistor.

Therefore, in the display device 100 according to an embodiment of the present invention, the writing transistor SST having a switching function and the transistor constituting the gate driving circuits 104_1 and 104_2 are the top gate drive or dual gate drive, and the driving transistor having a current control function is the bottom gate drive. In addition, in the present specification and the like, the top gate drive is such that on/off is controlled by the gate electrode arranged above the oxide semiconductor layer. The top gate driving transistor may be a top gate structure formed of the gate electrode arranged above the oxide semiconductor layer or a dual gate structure formed of the gate electrode arranged above and below the oxide semiconductor layer. In addition, in this specification and the like, the bottom gate drive is such that on/off is controlled by the gate electrode arranged below the oxide semiconductor layer. The bottom gate driving transistor may be a bottom gate structure formed of the gate electrode arranged below the oxide semiconductor layer, or may be a dual gate structure formed of the gate electrode arranged above and below the oxide semiconductor layer. In addition, in the present specification, the dual gate drive is such that on/off is controlled by inputting the same control signal to the gate electrodes arranged above and below the oxide semiconductor layer.

<Cross-Sectional Structure of Pixel>

Figure 3:
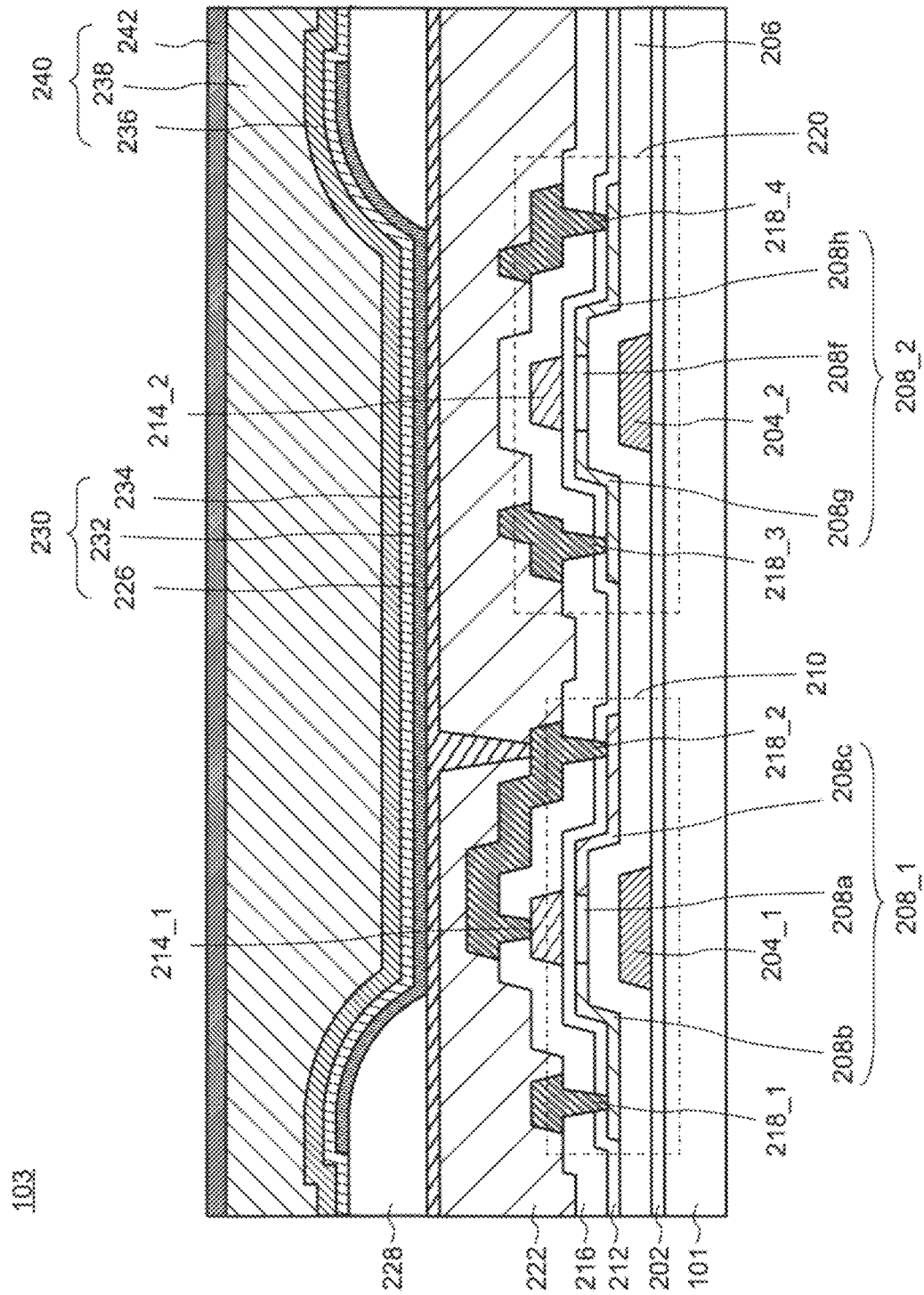
FIG. 3 is a diagram illustrating a cross-sectional structure of a pixel of a display device according to an embodiment of the present invention.

FIG. 3 is a diagram illustrating a cross-sectional structure of the pixel 103 of the display device 100 according to an embodiment of the present invention. As shown in FIG. 3, a transistor 210 and a transistor 220 are arranged on the substrate 101 via a base film 202. The transistor 210 is connected to a light-emitting element 230. In this case, the transistor 210 corresponds to the driving transistor DRT, the transistor 220 corresponds to the writing transistor SST, and the light-emitting element 230 corresponds to the light-emitting element OLED.

The transistor 210 functioning as the driving transistor DRT has a dual gate structure. The transistor 210 includes at least a conductive layer 204_1, an insulating film 206 arranged on the conductive layer 204_1, an oxide semiconductor layer 208_1 arranged on the insulating film 206, an insulating film 212 arranged on the oxide semiconductor layer 208_1, and a conductive layer 214_1 arranged on the insulating film 212. In this case, the first control terminal for controlling switching of the transistor 210 is the conductive layer 204_1. Therefore, the transistor 210 is the bottom gate drive. In addition, the conductive layer 204_1 also functions as a light-shielding layer for suppressing a back surface of the oxide semiconductor layer 208 from being irradiated with light. The second control terminal is the conductive layer 214_1. In this case, the oxide semiconductor layer 208_1 includes a channel area 208a and high concentration impurity areas 208b and 208c. The high concentration impurity areas 208b and 208c are arranged with the channel area 208a interposed therebetween. In this case, the channel area 208a overlaps the conductive layer 204_1. The insulating film 206 functions as a gate insulating film of the transistor 210. An insulating film 216 is arranged on the oxide semiconductor layer 208_1. The insulating film 216 functions as an interlayer insulating film. A source electrode and a drain electrode 218_1 and 218_2 are arranged on the insulating film 216. The source electrode or drain electrode 218_1 is connected to the high concentration impurity area 208b via a contact hole arranged in the insulating films 212 and 216. The source electrode or drain electrode 218_2 is connected to the high concentration impurity area 208c and the conductive layer 214_1. The conductive layer 214_1 is connected to a pixel electrode 226 of the light-emitting element OLED via the source electrode or drain electrode 218_2. Although not shown, the conductive layer 204_1 is electrically connected to one of a source electrode or drain electrode 218_3 and 218_4. The conductive layer 214_1 may be connected to a fixed potential in addition to the embodiment shown in FIG. 3. Examples of the fixed potential include the high potential power source Pvdd which is a driving power source of the light-emitting element OLED, or the low potential power source Pvss, and the like.

The transistor 220 functioning as the writing transistor SST is a dual gate structure. The transistor 220 includes at least a conductive layer 204_2, the insulating film 206 arranged on the conductive layer 204_2, an oxide semiconductor layer 208_2 arranged on the insulating film 206, the insulating film 212 arranged on the oxide semiconductor layer 208_2, and a conductive layer 214_2 arranged on the insulating film 212. In this case, the first control terminal for controlling switching of the transistor 220 is the conductive layer 204_2 and the conductive layer 214_2. Therefore, the transistor 220 is the dual gate drive. In addition, the conductive layer 204_1 also functions as a light-shielding layer for suppressing a back surface of the oxide semiconductor layer 208 from being irradiated with light. The insulating film 206 and the insulating film 212 function as the gate insulating films. The oxide semiconductor layer 208_2 has a channel area 208f and high concentration impurity areas 208g and 208h. The high concentration impurity areas 208g and 208h are arranged with the channel area 208f interposed therebetween. In this case, the channel area 208f overlaps the conductive layer 214_2. The insulating film 216 is arranged on the conductive layer 214_2. The source electrode and the drain electrode 218_3 and 218_4 are arranged on the insulating film 216. The source electrode and the drain electrode 218_3 and 218_4 are connected to the high concentration impurity areas 208g and 208h via the contact holes arranged in the insulating films 212 and 216.

In the present embodiment, a dual-gate driving transistor having a dual gate structure is arranged as the writing transistor SST and a bottom-gate driving transistor having a dual gate structure is arranged as the driving transistor DRT on the same substrate in the display device 100. In this case, among the insulating films 206 and 212 vertically sandwiching the oxide semiconductor layers 208_1 and 208_2, both the insulating film 212 and the insulating film 206 are made to function as the gate insulating film in the writing transistor SST, and the insulating film 206 is made to function as the gate insulating film in the driving transistor DRT. The thickness of the insulating film 212 is smaller than the thickness of the insulating film 206. Therefore, the thicknesses of gate insulating films can be made different between the writing transistor SST and the driving transistor DRT. Although the writing transistor SST is configured as a dual gate drive, a threshold voltage is dominated by the voltage applied by the conductive layer 214_2 arranged via the thin insulating film 212.

Since the gate insulating film of the writing transistor SST can be made thinner than the gate insulating film of the driving transistor DRT, an electric field is easily applied to the oxide semiconductor layer 208_2, and the ON current can be increased. In addition, in the writing transistor SST, since an impurity element is added to the oxide semiconductor layer 208_2 using the conductive layer 214_2 as a mask, a channel length L can be shortened. In an embodiment of the present invention, the writing transistor SST and the driving transistor DRT may have a channel length L of, for example, 1.5 μm or more and 4.0 μm or less. As a result, the S value of the writing transistor SST can be reduced, so that the switching characteristics of the writing transistor SST are improved. On the other hand, since the gate insulating film of the driving transistor DRT can be made thicker than the gate insulating film of the writing transistor SST, an electric field is less likely to be applied to the oxide semiconductor layer 208_1, and the ON current of the driving transistor DRT can be reduced. In addition, since the S value of the driving transistor DRT can be increased, the current change can be reduced in the low gradation area controlled by the minute current, and the gradation can be finely controlled. As a result, it is possible to suppress the occurrence of display unevenness in the display area 102. Further, since a large amount of current can be suppressed from flowing through the driving transistor DRT, it is possible to suppress a decrease in reliability due to thermal degradation.

In the driving transistor DRT, the conductive layer 214_1 and the high concentration impurity area 208c are connected via the source electrode or drain electrode 218_2. The conductive layer 214_1 is connected to the pixel electrode 226 of the light-emitting element OLED via the source electrode or drain electrode 218_2. This makes it possible to stabilize the driving transistor DRT. Therefore, it is possible to suppress the occurrence of display unevenness in the display area 102.

In addition, the gate driving circuits 104_1 and 104_2 can be driven at high speed by applying the transistor 220 having the same structure as the writing transistor SST to the transistor constituting the gate driving circuits 104_1 and 104_2.

A flattening film 222 is arranged on the source electrodes or drain electrodes 218_1 to 218_4. An organic resin material such as polyimide, polyamide, acryl, or epoxy can be used as the flattening film 222. These materials can be formed into films by a solution coating method and have a high flattening effect. In addition, the flattening film 222 is not arranged in the peripheral area 109.

The transistor 210 is connected to the light-emitting element 230. The light-emitting element 230 has the pixel electrode 226, an organic layer 232, and a common electrode 234. In an embodiment of the present invention, the display device 100 may be a top-emission type or a bottom-emission type. In the present embodiment, the display device 100 is a top-emission structure. In the top-emission structure, the pixel electrode 226 is the anode and the common electrode 234 is the cathode.

The pixel electrode 226 is arranged on the flattening film 222. The pixel electrode 226 is arranged for each pixel 103. The pixel electrode 226 is connected to the source electrode or drain electrode 218_2 of the transistor 210 via a contact hole arranged in the flattening film 222. A highly reflective metal film is used as the pixel electrode 226. Alternatively, a stacked structure of a high-work-function transparent conductive layer such as an indium-oxide-based transparent conductive layer (e.g., ITO) or a zinc-oxide-based transparent conductive layer (e.g., IZO, ZnO) and a metal film can be used as the pixel electrode 226.

An insulating layer 228 is arranged to cover an end portion of the pixel electrode 226. The insulating layer 228 may also be referred to as a barrier or a bank. Photosensitive acryl is used as the insulating layer 228 in the same manner as the flattening film 222. In the insulating layer 228, an opening is preferably opened so that the pixel electrode 226 is exposed, and an end portion of the opening is preferably a gently tapered shape. If the end portion of the opening is steep, a coverage defect of the organic layer 232 formed later occurs.

A plurality of organic materials constituting the organic layer 232 is stacked on the pixel electrode 226 and the insulating layer 228. The organic layer 232 is arranged by stacking a positive hole transport layer, a light-emitting layer, an electron transport layer, and the like in this order from the pixel electrode 226 side. These layers may be formed by vapor deposition or may be formed by coating after solvent dispersion. In addition, the positive hole transport layer, the electron transport layer, and the like may be selectively formed with respect to each sub-pixel or may be formed on the entire surface of the display area 102.

The common electrode 234 is arranged on the organic layer 232. Since the present embodiment is the top-emission structure, the common electrode 234 needs to have light transmittance. In the case where MgAg is used as the common electrode 234, it is formed in a thin film such that the light emitted from the organic layer 232 is transmitted therethrough. The common electrode 234 is connected to a wiring layer at a cathode contact portion arranged in the peripheral area 109, and is electrically connected to the terminal 106.

A sealing film 240 is arranged on the common electrode 234. The sealing film 240 is arranged to suppress the moisture that has entered from the outside from entering the organic layer 232. The present embodiment shows an example in which the sealing film 240 is formed in a three-layer structure of an inorganic insulating layer 236, an organic insulating layer 238, and an inorganic insulating layer 242. Silicon nitride with high gas barrier properties is preferably used as the inorganic insulating layer 236 and 233, and an organic resin material having high flexibility is preferably used as the organic insulating layer 238. In addition, a silicon oxide film or an amorphous silicon film may be arranged between the silicon nitride and the organic resin material. As a result, the adhesion between the silicon nitride and the organic resin material can be improved. For example, an overcoat layer may be arranged on the inorganic insulating layer 242 for flattening.

A touch sensor 110 is arranged on the sealing film 240. The touch sensor 110 may be formed directly on the sealing film 240. Alternatively, a cover glass on which the touch sensor 110 is formed may be arranged on the sealing film 240.

<Manufacturing Method of Display Device>

Next, a manufacturing process of the display device 100 according to an embodiment of the present invention will be described with reference to FIG. 4 to FIG. 8.

Figure 4:
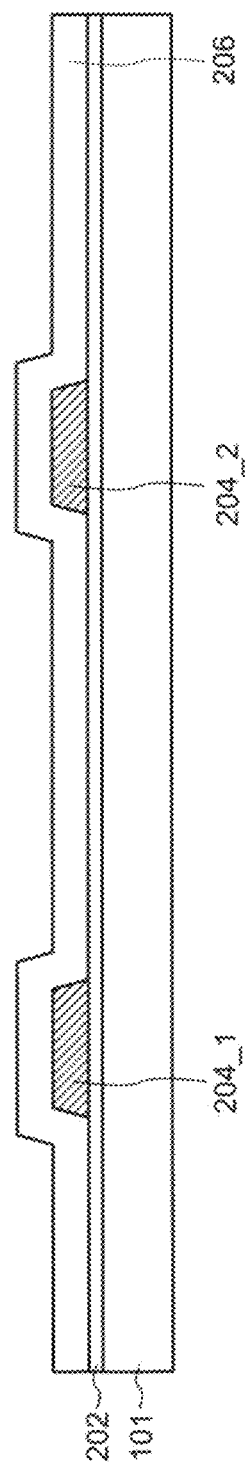
FIG. 4 is a cross-sectional view illustrating a manufacturing method of a display device according to an embodiment of the present invention.

FIG. 4 is a diagram illustrating a process of forming the base film 202 to the insulating film 206 on the substrate 101. A glass substrate, a quartz substrate, and a flexible substrate (polyimide, polyethylene terephthalate, polyethylene naphthalate, triacetyl cellulose, cyclic olefin copolymer, cycloolefin polymer, other resin substrates having flexibility) can be used as the substrate 101.

The base film 202 is formed on the substrate 101. Silicon oxide or silicon nitride may be used as the base film 202 in a single layer, or a stacked layer may be used by combining silicon oxide and silicon nitride. The conductive layers 204_1 and 204_2 are formed on the base film 202. The conductive layers 204_1 and 204_2 are formed by forming a conductive film on the base film 202 and processing by a photolithography method. For example, aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), bismuth (Bi), and the like can be used as the conductive layers 204_1 and 204_2. In addition, an alloy of these metals may be used.

Next, the insulating film 206 is formed on the conductive layers 204_1 and 204_2. Silicon oxide or silicon nitride may be used as the insulating film 206 in a single layer, or a stacked layer may be used by combining silicon oxide and silicon nitride. In addition, a thickness of the insulating film 206 is preferably larger than a thickness of the insulating film 212 described later. For example, the thickness of the insulating film 206 is preferably 250 nm or more and 500 nm or less.

Figure 5:
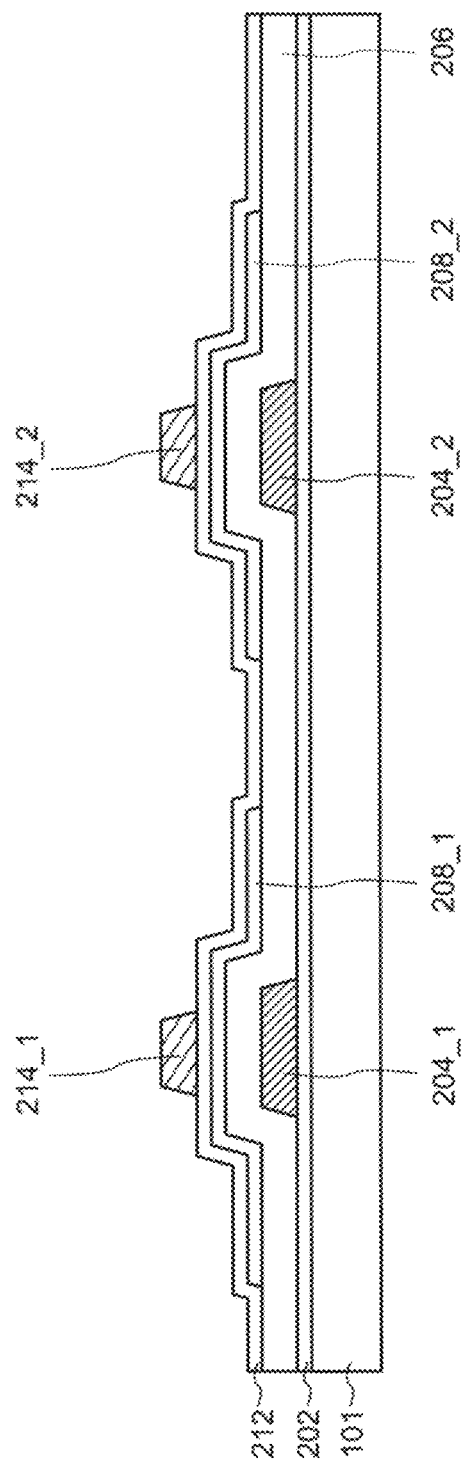
FIG. 5 is a cross-sectional view illustrating a manufacturing method of a display device according to an embodiment of the present invention.

FIG. 5 is a diagram illustrating a process of forming the oxide semiconductor layers 208_1 and 208_2 to the conductive layers 214_1 and 214_2 on the insulating film 206. First, the oxide semiconductor layers 208_1 and 208_2 are formed on the insulating film 206. The oxide semiconductor layers 208_1 and 208_2 are formed by forming an oxide semiconductor film by a sputtering method and processing by a photolithography method. For example, the oxide semiconductor film is preferably formed to have a film thickness of 30 nm or more and 100 nm or less by a sputtering method. The oxide semiconductor layers 208_1 and 208_2 may contain, for example, a Group 13 element such as indium or gallium. The oxide semiconductor layers 208_1 and 208_2 may contain a plurality of different Group 13 elements and may be a compound of indium and gallium (IGO). The oxide semiconductor layers 208_1 and 208_2 may further contain a Group 12 element. For example, examples include a compound (IGZO) containing indium, gallium, and zinc. The oxide semiconductor layers 208_1 and 208_2 may contain another element, and may contain tin, which is a Group 14 element, titanium/zirconium, or the like, which is a Group 4 element.

Specifically, the oxide semiconductor layers 208_1 and 208_2 may be made of $InO_x$, $ZnO_x$, $SnO_x$, In—Ga—O, In—Zn—O, In—Al—O, In—Sn—O, In—Hf—O, In—Zr—O, In—W—O, In—Y—O, In-Ga—Zn—O, In—Al—Zn—O, In—Sn—Zn—O, In—Hf—Zn—O, In—Ga—Sn—O, In—Al—Sn—O, In—Hf—Sn—O, In—Ga—Al—Zn—O, In—Ga—Hf—Zn—O, In—Sn—Ga—Zn—O or the like. The crystallinity of the oxide semiconductor layers 208_1 and 208_2 is not limited, and may be monocrystalline, polycrystalline, microcrystalline, or amorphous.

When the oxide semiconductor film is formed, a power source applied to an oxide semiconductor target may be a direct current (DC) or an alternating current power source (AC), and may be determined by the shape, composition, and the like of the oxide semiconductor target. For example, InGaZnO in a ratio of In:Ga:Zn:O=1:1:1:4 ($In_2O_3$:$Ga_2O_3$:ZnO=1:1:2) or the like can be used as the oxide semiconductor target. In addition, the composition ratio can be determined depending on the purpose, such as the characteristics of the transistor.

An oxygen gas, a mixed gas of oxygen and a rare gas, or a rare gas can be used as a sputtering gas for forming the oxide semiconductor film. The sputtering gas for forming the oxide semiconductor film is preferably a mixed gas atmosphere of oxygen and a rare gas, and more preferably an oxygen gas flow rate ratio to the rare gas is 5% or more. It is preferred to set the oxygen gas flow rate to 5% or more because oxygen is easily added to the oxide semiconductor film.

Next, the insulating film 212 is formed on the oxide semiconductor layers 208_1 and 208_2. Silicon oxide or silicon nitride may be used as the insulating film 212 in a single layer, or a stacked layer may be used by combining silicon oxide and silicon nitride. The thickness of the insulating film 212 is preferably smaller than the thickness of the insulating film 206. For example, the thickness of the insulating film 212 is preferably 100 nm or more and 200 nm or less.

A heat treatment may be performed at least once after the oxide semiconductor film is formed, after the oxide semiconductor layers 208_1 and 208_2 are formed, or after the insulating film 212 is formed. Since the volumes of the oxide semiconductor layers 208_1 and 208_2 may be reduced (shrunk) by the heat treatment, the heat treatment is preferably performed before the processing by the photolithography method. After the oxide semiconductor film is formed, by performing the heat treatment at least once after the oxide semiconductor layers 208_1 and 208_2 are formed, or after the insulating film 212 is formed makes it possible to improve the film quality, such as reducing the hydrogen concentration, increasing the density, and the like of the oxide semiconductor layers 208_1 and 208_2.

The heat treatment performed on the oxide semiconductor film or the oxide semiconductor layers 208_1 and 208_2 can be performed at atmospheric pressure or low pressure (vacuum) in the presence of nitrogen, dry air, or atmosphere. The heating temperature is 250° C. to 500° C., preferably 350° C. to 450° C. In addition, the heating time is, for example, 15 minutes or more and 1 hour or less. By the heat treatment, oxygen is introduced into oxygen vacancies of the oxide semiconductor layers 208_1 and 208_2 or the oxygen is dislocated, whereby the oxide semiconductor layers 208_1 and 208_2 having less crystalline defects and higher crystallinity are obtained. In addition, the hydrogen concentration of the oxide semiconductor layers 208_1 and 208_2 can be reduced by the heat treatment.

Next, the conductive layers 214_1 and 214_2 are formed on the insulating film 212. The conductive layers 214_1 and 214_2 are formed by forming a conductive film on the insulating film 212 and processing by a photolithography method. For example, the same materials as those of the conductive layers 204_1 and 204_2 can be used as the conductive layers 214_1 and 214_2. The conductive layer 214_1 is formed in an area overlapping the conductive layer 204_1 and the oxide semiconductor layer 208_1, and the conductive layer 2142 is formed in an area overlapping the conductive layer 204_2 and the oxide semiconductor layer 208_2.

Figure 6:
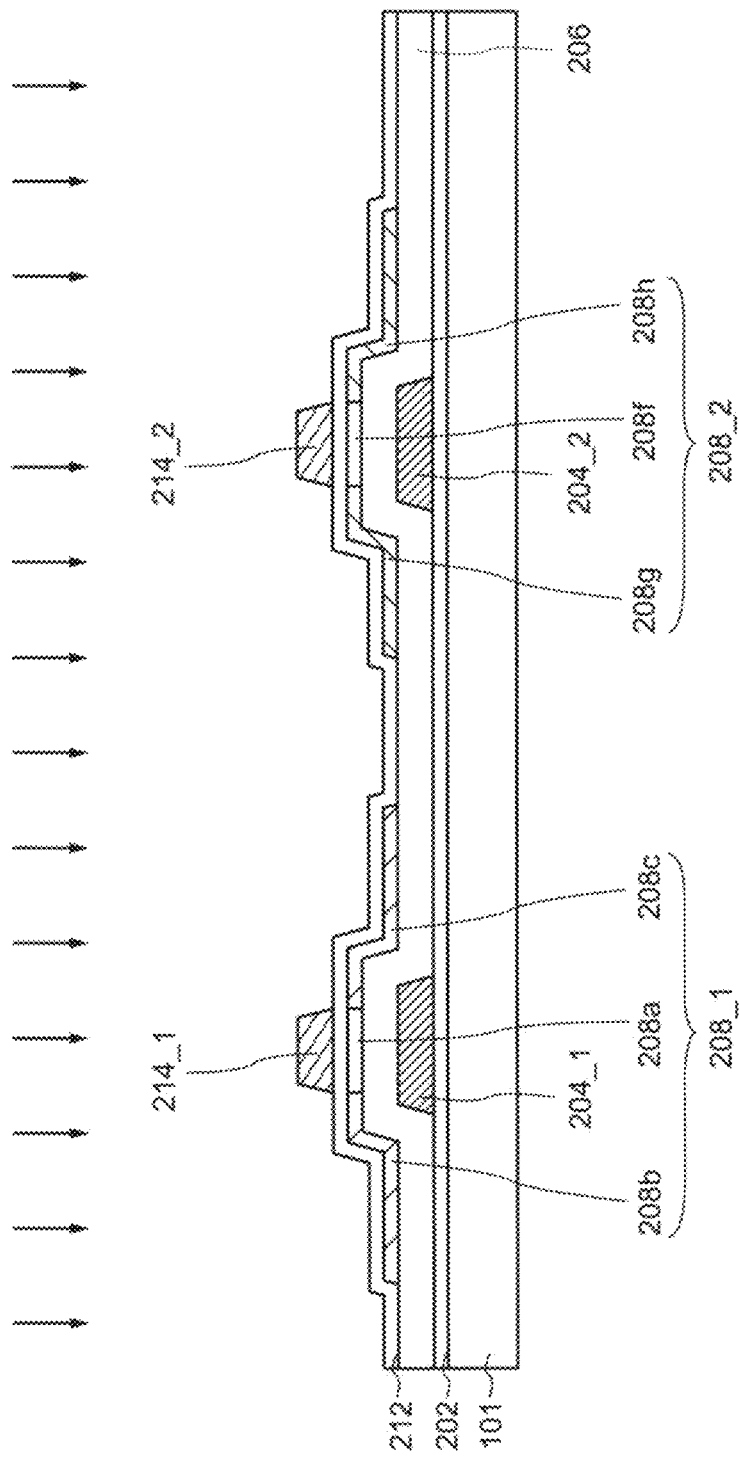
FIG. 6 is a cross-sectional view illustrating a manufacturing method of a display device according to an embodiment of the present invention.

FIG. 6 is a diagram illustrating a step of adding an impurity element to the oxide semiconductor layers 208_1 and 208_2 by ion-implantation. Impurity elements are added to the oxide semiconductor layers 208_1 and 208_2 by ion-implantation using the conductive layers 214_1 and 214_2 as masks. In this case, hydrogen, argon, phosphorus, boron, or the like is used as the impurity element. Since the addition of the impurity element to the oxide semiconductor layer is not intended to control the conductivity type of the transistor, the type of the impurity element is not particularly limited. The impurity element is added to the oxide semiconductor layers 208_1 and 208_2 at a concentration (dose amount) of $1\times10^{14}$ atoms/cm$^2$ to $5\times10^{15}$ atoms/cm$^2$. As a result, in the oxide semiconductor layers 208_1, the high concentration impurity areas 208b and 208c are formed in an area not overlapping the conductive layer 214_1, and the channel area 208a is formed in an area overlapping the conductive layer 214_1. In the oxide semiconductor layers 208_2, the high concentration impurity areas 208g and 208h are formed in an area not overlapping the conductive layer 214_2, and the channel area 208f is formed in an area overlapping the conductive layer 214_2. The high concentration impurity areas 208b, 208c, 208g, and 208h contain the impurity element at a concentration of about $5 \times 10^{13}$ atoms/cm$^3$ to $2.5 \times 10^{15}$ atoms/cm$^3$. The concentration of the impurity element contained in the oxide semiconductor layers 208_1 and 208_2 can be measured by, for example, Secondary Ion Mass Spectrometry (SIMS).

Adding the impurity element to the oxide semiconductor layers 208_1 and 208_2 causes crystal defects in the oxide semiconductor layers 208_1 and 208_2, which reduces the resistance of the area. The resistance of the oxide semiconductor layers 208_1 and 208_2 can be reduced depending on the concentration of the added impurity element. The resistance remains high because the channel areas 208a and 208f have less crystalline defects and less hydrogen concentration. In this way, the resistance of the high concentration impurity areas 208b, 208c, 208g, and 208h can be made lower than the resistance of the channel areas 208a and 208f.

Figure 7:
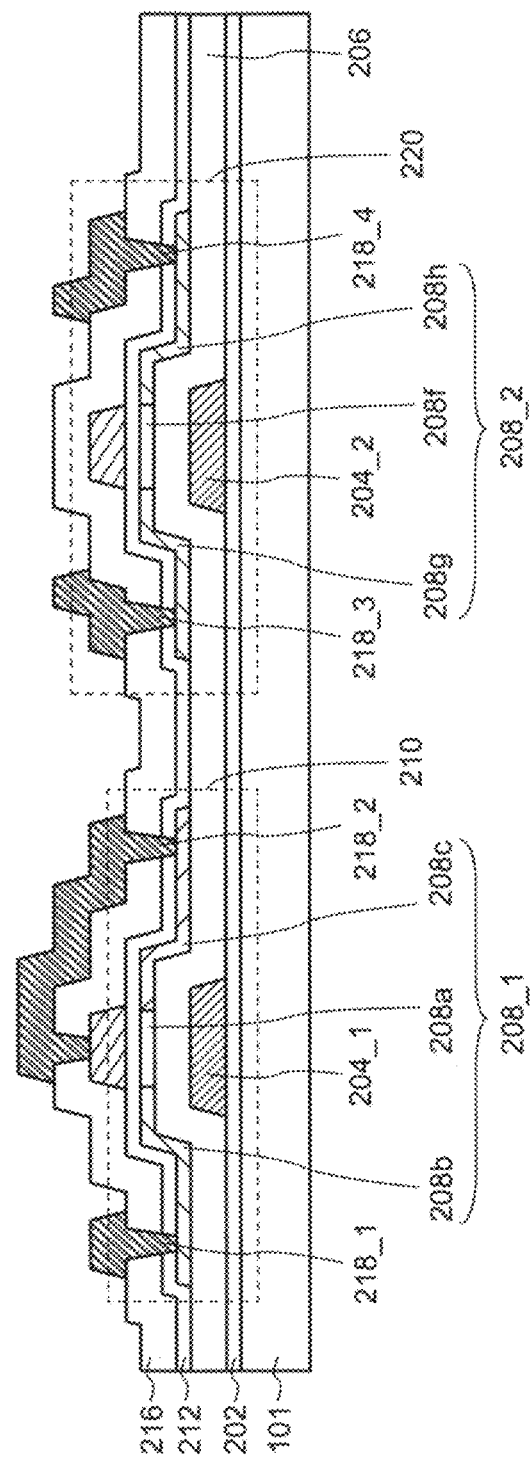
FIG. 7 is a cross-sectional view illustrating a manufacturing method of a display device according to an embodiment of the present invention.

FIG. 7 is a diagram illustrating a process of forming the source electrodes and the drain electrodes 218_1 to 218_4 from the insulating film 216 on the oxide semiconductor layers 208_1 and 208_2. First, the insulating film 216 is formed on the oxide semiconductor layers 208_1 and 208_2. Silicon oxide or silicon nitride may be used as the insulating film 216 in a single layer, or a stacked layer may be used by combining silicon oxide and silicon nitride. In addition, a thickness of the insulating film 216 is preferably larger than the thickness of the insulating film 212. For example, the thickness of the insulating film 216 is preferably 250 nm or more and 500 nm or less.

Next, a contact hole reaching the oxide semiconductor layers 208_1 and 208_2 and the conductive layer 214_1 is formed in the insulating film 212 and the insulating film 216. Next, the source electrodes are the drain electrodes 218_1 to 218_4 are formed on the insulating film 216. The source electrodes or drain electrodes 218_1 to 218_4 are formed by forming a conductive film on the insulating film 216 and processing the conductive film by a photolithography method. Therefore, the source electrode or drain electrode 218_1 is connected to the high concentration impurity area 208b, and the source electrode or drain electrode 218_2 is connected to the high concentration impurity area 208c and the conductive layer 214_1. The source electrode or drain electrode 218_3 is connected to the high concentration impurity area 208g, and the source electrode or drain electrode 218_4 is connected to the high concentration impurity area 208h. The same materials as those of the conductive layers 204_1 and 204_2 can be used as the source electrodes and the drain electrodes 218_1 to 218_4. Although not shown, a contact hole reaching the conductive layer 204_1 may be formed in the insulating films 206, 212, and 216 during this process. Therefore, the conductive layer 204_1 and the source electrode or drain electrode 218_3 can be connected to each other. Through the steps so far, the transistors 210 and 220 can be formed.

Figure 8:
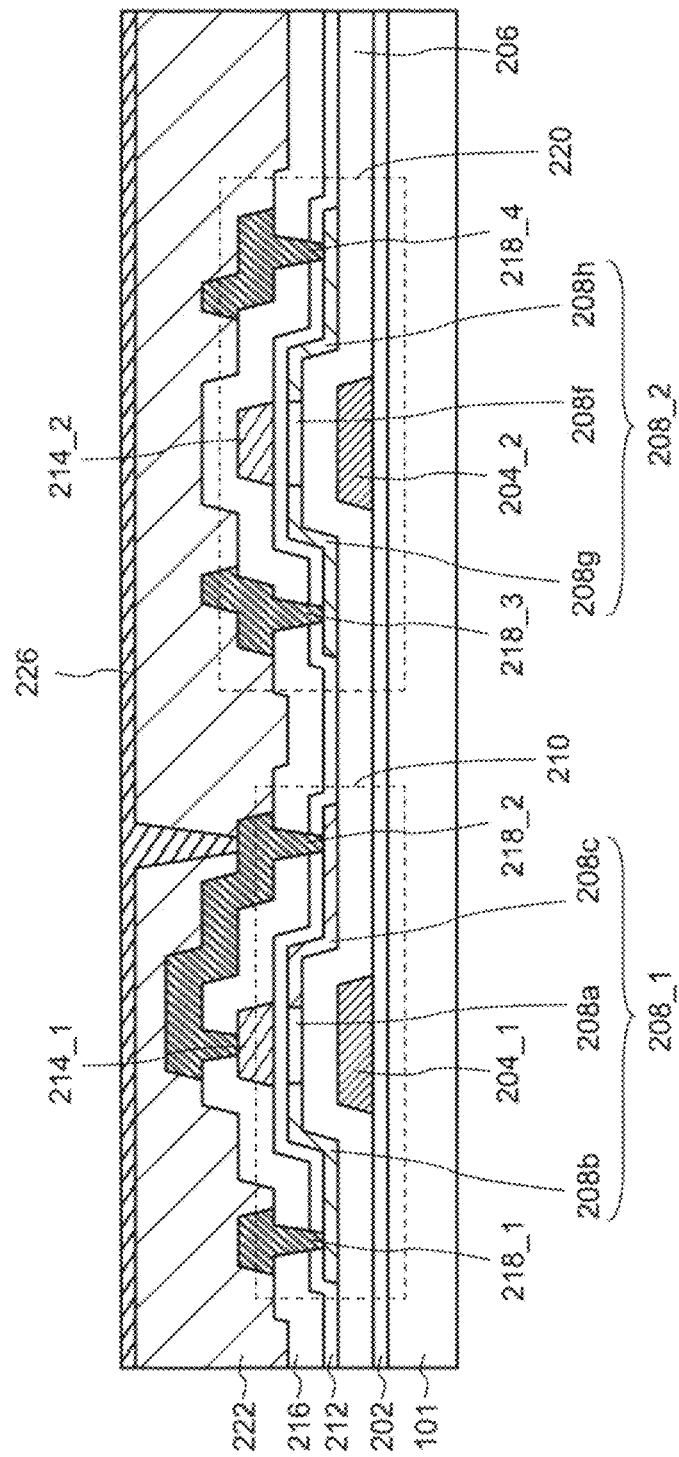
FIG. 8 is a cross-sectional view illustrating a manufacturing method of a display device according to an embodiment of the present invention.

FIG. 8 is a diagram illustrating a process of forming the flattening film 222 and the pixel electrode 226. the flattening film 222 is formed on the source or drain electrodes 218_1 to 218_4. An organic resin material such as polyimide, acryl, or epoxy can be used as the flattening film 222. These materials can be formed into films by a solution coating method and have a high flattening effect.

The light-emitting element 230 is formed by forming the pixel electrode 226, the organic layer 232, and the common electrode 234. First, a contact hole reaching the source electrode or drain electrode 218_2 is formed in the flattening film 222. Next, the pixel electrode 226 is formed on the flattening film 222. The pixel electrode 226 is formed by forming a conductive film on the flattening film 222 and processing the conductive film by a photolithography method. The insulating layer 228 opened such that the pixel electrode 226 is exposed is formed. Next, a plurality of organic materials constituting the organic layer 232 is formed on the pixel electrode 226 and the insulating layer 228. Next, the common electrode 234 is formed on the organic layer 232.

After that, the inorganic insulating layer 236, the organic insulating layer 238, and the inorganic insulating layer 242 are formed on the common electrode 234 to form the sealing film 240. First, the inorganic insulating layer 236 is formed on the common electrode 234. Next, the organic insulating layer 238 is formed on the inorganic insulating layer 236. Next, the inorganic insulating layer 242 is formed on the organic insulating layer 238. In this case, the inorganic insulating layer 236 is preferably in contact with the end portion and the inorganic insulating layer 242 to seal the organic insulating layer 238. As a result, it is possible to suppress the light-emitting element 230 from deteriorating due to the entry of moisture from the outside of the sealing film 240.

Through the above steps, the display device 100 having the structure of the pixel 103 shown in FIG. 3 can be manufactured.

According to a manufacturing process of the display device 100 according to an embodiment of the present invention, it is possible to form two types of transistors that are different in properties and structure more easily without increasing the number of processes even in a small area within one pixel.

Modification 1

Next, a pixel 103A having a structure partially different from the structure of the pixel 103 shown in FIG. 3 will be described with reference to FIG. 9.

Figure 9:
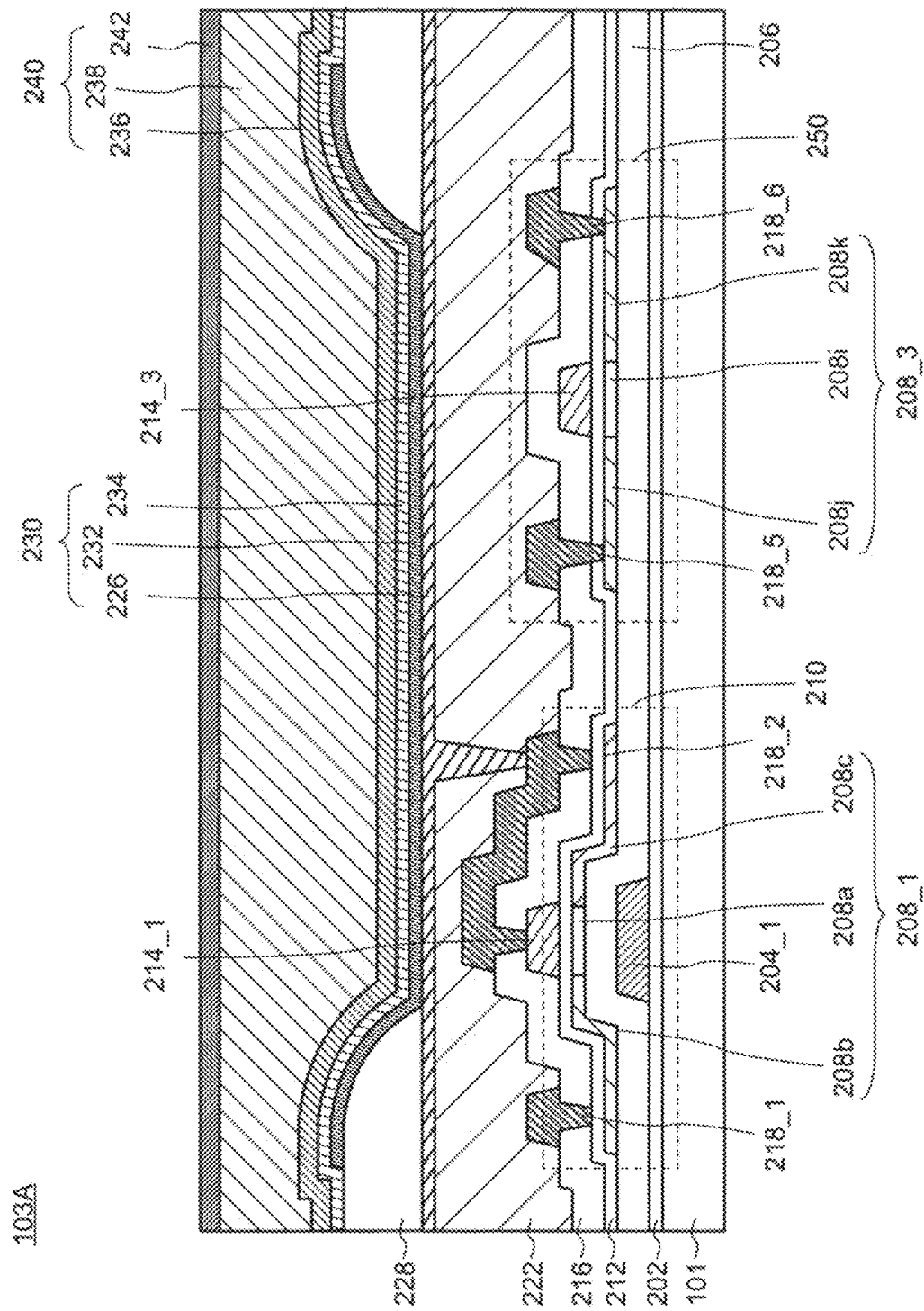
FIG. 9 is a diagram illustrating a cross-sectional structure of a pixel of a display device according to an embodiment of the present invention.

FIG. 9 is a diagram illustrating a cross-sectional structure of the pixel 103A of the display device 100 according to an embodiment of the present invention. As shown in FIG. 9, the transistor 210 and a transistor 250 are arranged on the substrate 101 via the base film 202. In this case, the transistor 210 corresponds to the driving transistor DRT shown in FIG. 3, and the transistor 250 corresponds to the writing transistor SST shown in FIG. 3. In addition, since the structure of the transistor 210 is the same as that of the transistor 210 shown in FIG. 3, the description thereof is omitted.

The transistor 250 functioning as the writing transistor SST has a top gate structure. The transistor 250 has at least an oxide semiconductor layer 208_3 arranged on the insulating film 206, the insulating film 212 arranged on the oxide semiconductor layer 208_3, and a conductive layer 214_3 arranged on the insulating film 212. In this case, the control terminal for controlling switching of the transistor 250 is the conductive layer 214_3. The insulating film 212 functions as a gate insulating film. The oxide semiconductor layer 208 includes a channel area 208i and high concentration impurity areas 208j and 208k. The insulating film 212 is arranged on the conductive layer 2143. A source electrode and a drain electrode 218_5 and 218_6 are arranged on the insulating film 212. The source electrode and the drain electrode 218_5 and 218_6 are connected to the high concentration impurity areas 208j and 208k via the contact holes arranged in the insulating films 212 and 216.

Since the gate insulating film of the writing transistor SST can be made thinner than the gate insulating film of the driving transistor DRT, an electric field is easily applied to the oxide semiconductor layer 208_3, and the ON current can be increased. In addition, since the channel length L can be shortened, the switching characteristic is improved. On the other hand, since the gate insulating film of the driving transistor DRT can be made thicker than the gate insulating film of the writing transistor SST, the electric field is less likely to be applied to the oxide semiconductor layer 208_1, and the ON current can be made smaller. In particular, in the low gradation area controlled by a minute current, the change in the current of the driving transistor DRT can be reduced, so that the gradation can be finely controlled. As a result, it is possible to suppress the occurrence of display unevenness in the display area 102. Further, since a large amount of current can be suppressed from flowing through the driving transistor DRT, it is possible to suppress a decrease in reliability due to thermal degradation.

Second Embodiment

In the present embodiment, a structure of a pixel 103B having a structure partially different from the structure of the pixel 103 described in the first embodiment will be described with reference to FIG. 10 and FIG. 11. In addition, in the structure of the pixel 103B, parts having the same or similar functions as those of the pixel 103 are denoted by the same symbols, and a repeated explanation thereof is omitted.
<Equivalent Circuit Diagram>

Figure 10:
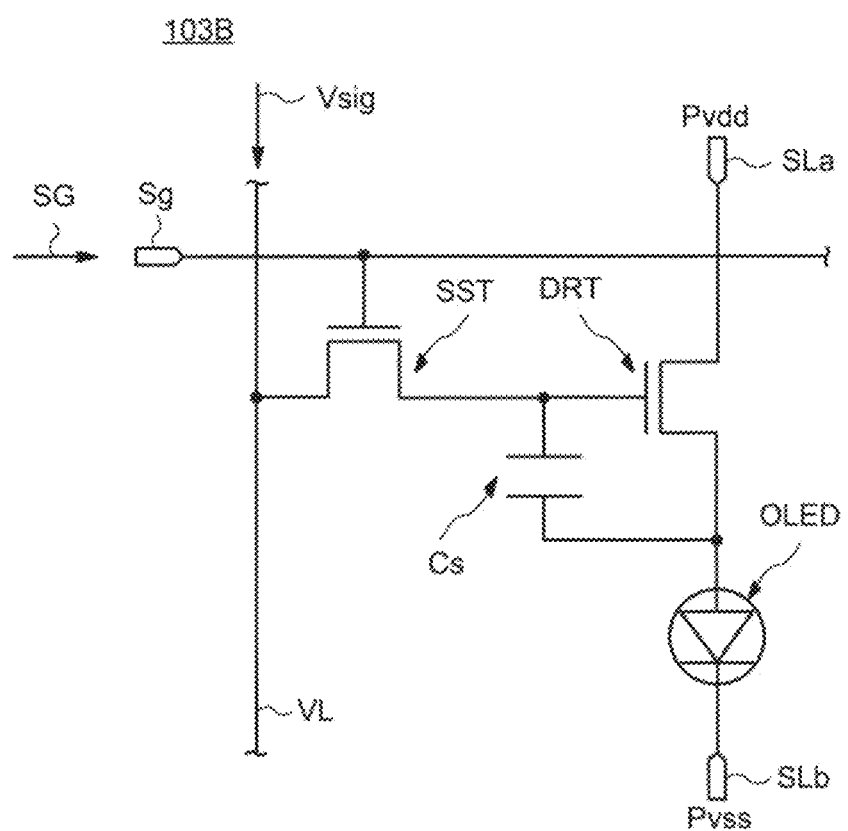
FIG. 10 is an equivalent circuit diagram of a pixel included in a display device according to an embodiment of the present invention.

FIG. 10 is an equivalent circuit diagram of the pixel 103B included in the display device 100 according to an embodiment of the present invention. The equivalent circuit diagram shown in FIG. 10 is different from the equivalent circuit diagram shown in FIG. 2 in the structure of the driving transistor DRT. In FIG. 10, the driving transistor DRT is the bottom gate drive, and the writing transistor SST is the top gate drive.
<Cross-Sectional Structure of Pixel>

Figure 11:
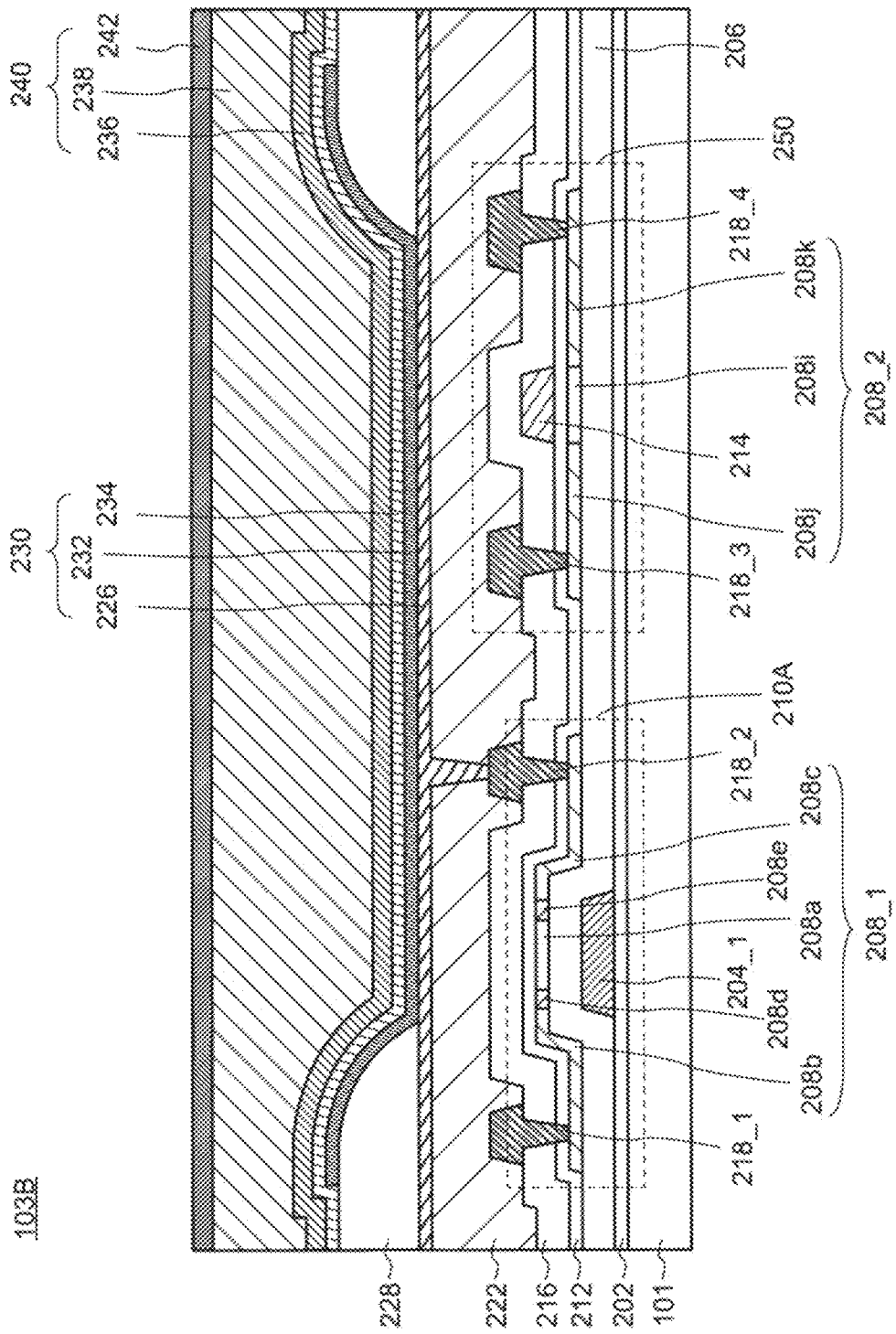
FIG. 11 is a diagram illustrating a cross-sectional structure of a pixel of a display device according to an embodiment of the present invention.

FIG. 11 is a diagram illustrating a cross-sectional structure of the pixel 103B of the display device 100 according to an embodiment of the present invention. As shown in FIG. 11, a transistor 210A and the transistor 250 are arranged on the substrate 101 via the base film 202. In this case, the transistor 250 corresponds to the writing transistor SST shown in FIG. 10, and the transistor 210A corresponds to the driving transistor DRT shown in FIG. 10. In addition, since the structure of the transistor 250 is the same as the structure of the transistor 250 shown in FIG. 9, a detailed description thereof will be omitted.

The transistor 210A functioning as the driving transistor DRT has a bottom gate structure. The transistor 210A includes at least the conductive layer 204_1, the insulating film 206 arranged on the conductive layer 204_1, and the oxide semiconductor layer 208_1 arranged on the insulating film 206. In this case, the oxide semiconductor layer 208_1 includes the channel area 208a, the high concentration impurity areas 208b and 208c, and low concentration impurity areas 208d and 208e. The low concentration impurity areas 208d and 208e are arranged with the channel area 208a interposed therebetween. The high concentration impurity areas 208b and 208c are arranged adjacent to the low concentration impurity areas 208d and 208e. In this case, the channel area 208a and the low concentration impurity areas 208d and 208e overlap the conductive layer 204_1. The insulating film 206 functions as the gate insulating film of the transistor 210. The insulating film 212 is arranged on the oxide semiconductor layer 208_1 and the insulating film 216 is further arranged on the insulating film 212. The thickness of the insulating film 206 is preferably larger than the thickness of the insulating film 212. The thickness of the insulating film 206 is 250 nm or more and 500 nm or less. The thickness of the insulating film 212 is 100 nm or more and 200 nm or less. The source electrode and the drain electrode 218_1 and 218_2 are arranged on the insulating film 216. The source electrode and the drain electrode 218_1 and 218_2 are connected to the high concentration impurity areas 208b and 208c via the contact holes arranged in the insulating films 212 and 216. Although not shown, the conductive layer 204_1 is electrically connected to one of the source electrode and the drain electrode 218_3 and 218_4.

In the transistor 210A shown in FIG. 11, the low concentration impurity areas 208d and 208e are arranged between the channel area 208a and the high concentration impurity areas 208b and 208c in the oxide semiconductor layer 208_1. As a result, the electric field applied in the vicinity of the end portion of the channel area 208a is reduced, so that the source/drain resistance can be improved. Since the low concentration impurity areas 208d and 208e overlap the conductive layer 204_1, the source/drain resistance can be further improved.

As shown in FIG. 11, in the display device 100, a transistor with a top gate structure is arranged as the writing transistor SST and a transistor with a bottom gate structure is arranged as the driving transistor DRT on the same substrate. In this case, among the insulating films 206 and 212 vertically sandwiching the oxide semiconductor layers 208_1 and 208_2, the insulating film 212 functions as a gate insulating film in the writing transistor SST, and the insulating film 206 functions as a gate insulating film in the driving transistor DRT. In this case, the thickness of the insulating film 212 is smaller than the thickness of the insulating film 206. Therefore, the thicknesses of gate insulating films can be made different between the writing transistor SST and the driving transistor DRT. That is, a thin gate insulating film can be applied to the SST in the top gate drive, and a thick gate insulating film can be applied to the driving transistor DRT in the bottom gate drive.

Since the gate insulating film of the writing transistor SST can be made thinner than the gate insulating film of the driving transistor DRT, an electric field is easily applied to the oxide semiconductor layer 208_2, and the ON current can be increased. In addition, in the writing transistor SST, since the impurity element is added to the oxide semiconductor layer 208_2 via the conductive layer 214_2, the channel length L can be shortened. This makes it possible to reduce the S value of the writing transistor SST. On the other hand, since the gate insulating film of the driving transistor DRT can be made thicker than the gate insulating film of the writing transistor SST, the electric field is less likely to be applied to the oxide semiconductor layer 2081, and the ON current can be made smaller. In particular, in the low gradation area controlled by a minute current, the change in the current of the driving transistor DRT can be reduced, so that the gradation can be finely controlled. As a result, it is possible to suppress the occurrence of display unevenness in the display area 102. Further, since a large amount of current can be suppressed from flowing through the driving transistor DRT, it is possible to suppress a decrease in reliability due to thermal degradation. In addition, as described in the first embodiment, in the case of performing the dual gate drive in the writing transistor SST, the BT stress of the gate is more significant than in the case of performing the one-side gate drive. Therefore, although there is an advantage that the on-off characteristics of the transistor become sharp, the reliability may be slightly sacrificed. Therefore, in the case where the driving capability is sufficiently high in the top gate driving and a back surface does not need to be shielded from light, the reliability can be improved by omitting the gate electrode on the bottom side.

<Manufacturing Process of Display Device>

Next, a manufacturing method of the display device 100 according to an embodiment will be described with reference to FIG. 12 to FIG. 15. In addition, with respect to the step of forming the base film 202 on the substrate 101 to the step of configuring the insulating film 212, the descriptions of FIG. 4 and FIG. 5 can be referred to.

Figure 12:
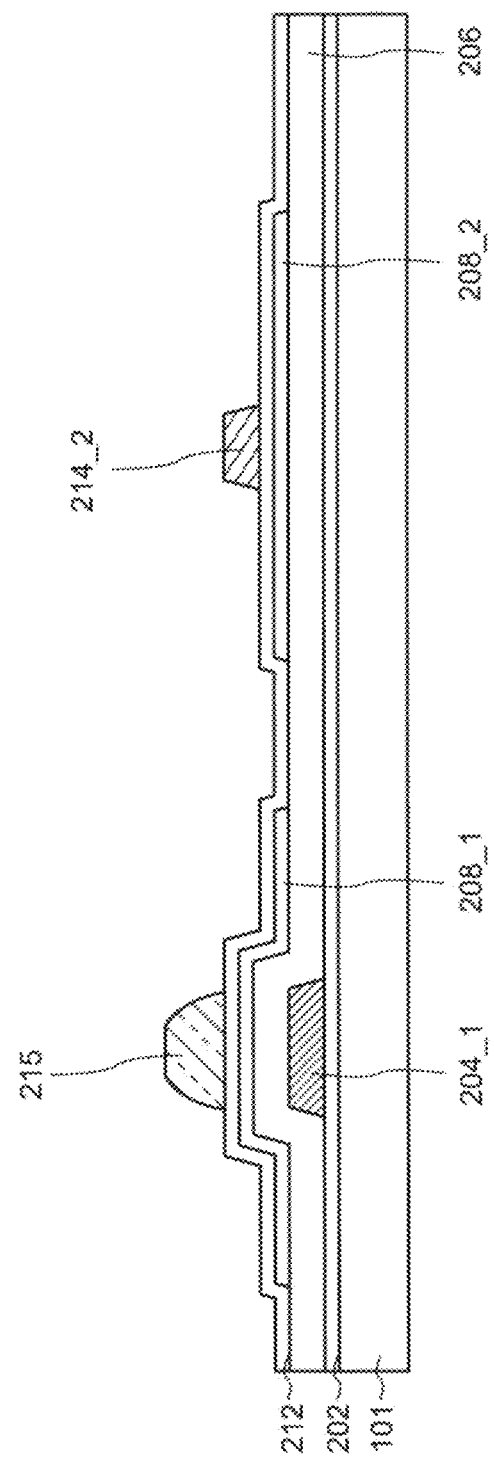
FIG. 12 is a cross-sectional view illustrating a manufacturing method of a display device according to an embodiment of the present invention.

FIG. 12 is a diagram illustrating a process of forming the conductive layer 214_2 and a resist mask 215 on the insulating film 212. First, the conductive layer 214_2 is formed on the insulating film 212. A conductive layer 214_4 is formed by forming a conductive film on the insulating film 212 and processing by a photolithography method. The conductive layer 214_2 is formed in an area overlapping the oxide semiconductor layer 208_2. Next, the resist mask 215 is formed on a part of the area overlapping the oxide semiconductor layer 208_1 arranged on the insulating film 212. In this case, the resist mask 215 is formed so that an end portion has a tapered shape. The resist mask 215 is not limited to the tapered shape as long as the thickness of the resist mask is reduced as it approaches the end portion.

Figure 13:
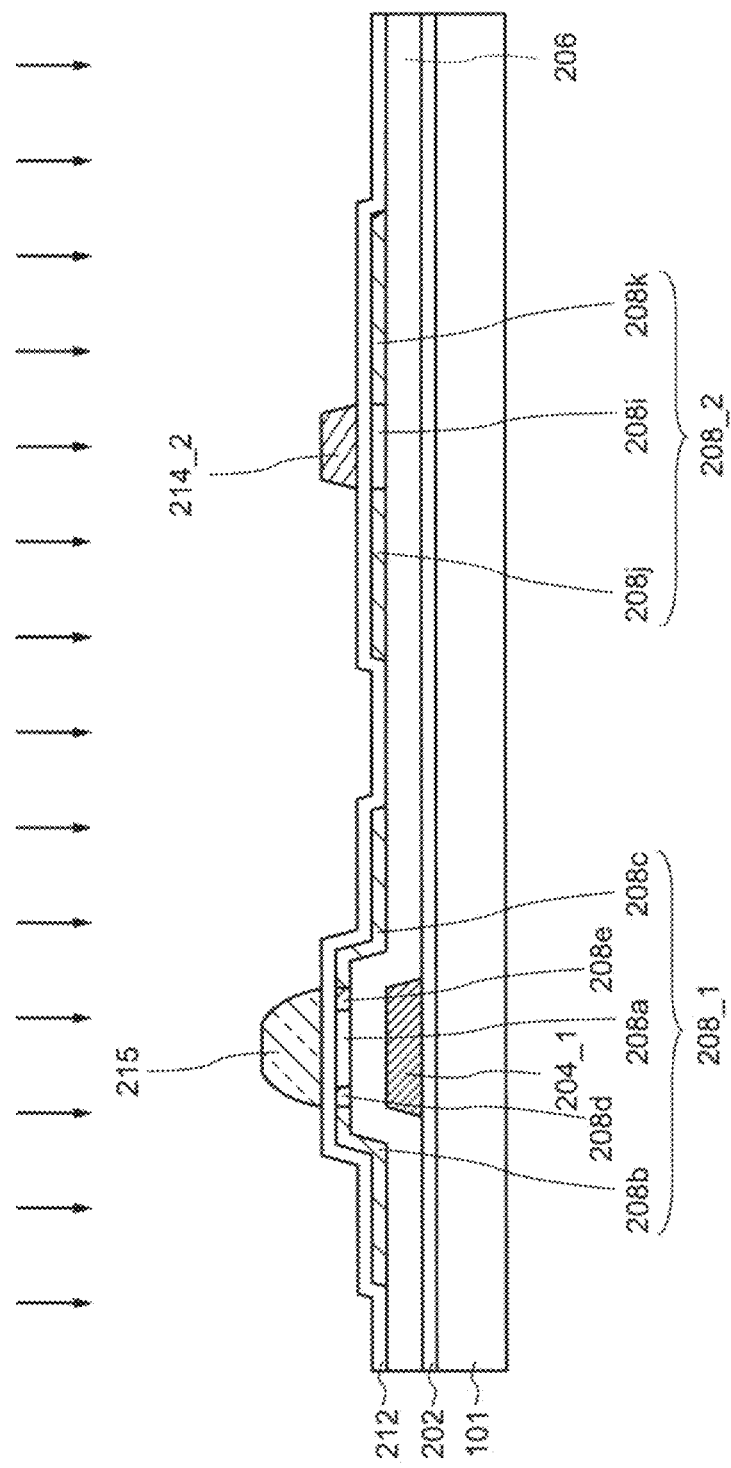
FIG. 13 is a cross-sectional view illustrating a manufacturing method of a display device according to an embodiment of the present invention.

FIG. 13 is a diagram illustrating a step of adding an impurity element to the oxide semiconductor layers 208_1 and 208_2 by ion-implantation. Impurity elements are added to the oxide semiconductor layers 208_1 and 208_2 by ion-implantation using the conductive layer 214_2 and the resist mask 215 as masks. The impurity element is added to the oxide semiconductor layers 208_1 and 208_2 at a concentration of $1\times10^{14}$ atoms/cm$^2$ to $5\times10^{15}$ atoms/cm$^2$. As a result, in the oxide semiconductor layer 208_2, the high concentration impurity areas 208g and 208h are formed in the area not overlapping the conductive layer 214_2, and the channel area 208f is formed in the area overlapping the conductive layer 214_2. The high concentration impurity areas 208g and 208h contain the impurity element at a concentration of about $5\times10^{13}$ atoms/cm$^3$ to $2.5\times10^{15}$ atoms/cm$^3$. At the same time, in the oxide semiconductor layer 208_1, the high concentration impurity areas 208b and 208c are formed in an area where the resist mask 215 does not overlap. In addition, in an area where the resist mask 215 overlaps the tapered shape, the impurity element is added via the resist mask 215, so that the low concentration impurity areas 208d and 208e are formed. In addition, within the resist mask 215, the channel area 208a is formed in an area overlapping a part other than the tapered shape. The high concentration impurity areas 208b and 208c contain the impurity element at a concentration of about $5\times10^{13}$ atoms/cm$^3$ to $2.5\times10^{15}$ atoms/cm$^3$. In addition, since the impurity element is added to the low concentration impurity areas 208d and 208e via the resist mask 215, the impurity element is contained at a concentration of about $2.5\times10^{12}$ atoms/cm$^3$ to $5\times10^{13}$ atoms/cm$^3$.

Adding the impurity element to the oxide semiconductor layers 208_1 and 208_2 causes crystal defects in the oxide semiconductor layers 208_1 and 208_2, which reduces the resistance of the area. The resistance of the oxide semiconductor layers 208_1 and 208_2 can be reduced depending on the concentration of the added impurity element. Therefore, the resistance of the high concentration impurity areas 208b, 208c, 208g, and 208h can be made lower than the resistance of the low concentration impurity areas 208d and 208e. In addition, using the resist mask 215 and the conductive layer 214_2 having a tapered shape as masks makes it possible to form a structure having the low concentration impurity areas 208d and 208e in the oxide semiconductor layer 208_1 in one addition process of impurity elements, so that it is possible to form a structure having no low concentration impurity area in the oxide semiconductor layer 208_2. On the other hand, the resistance remains high because the channel areas 208a and 208f have less crystalline defects and less hydrogen concentration. In this way, different oxide semiconductor layers 208_1 and 208_2 may be formed in the same process. In addition, the resist mask 215 is removed after the impurity element is added.

Figure 14:
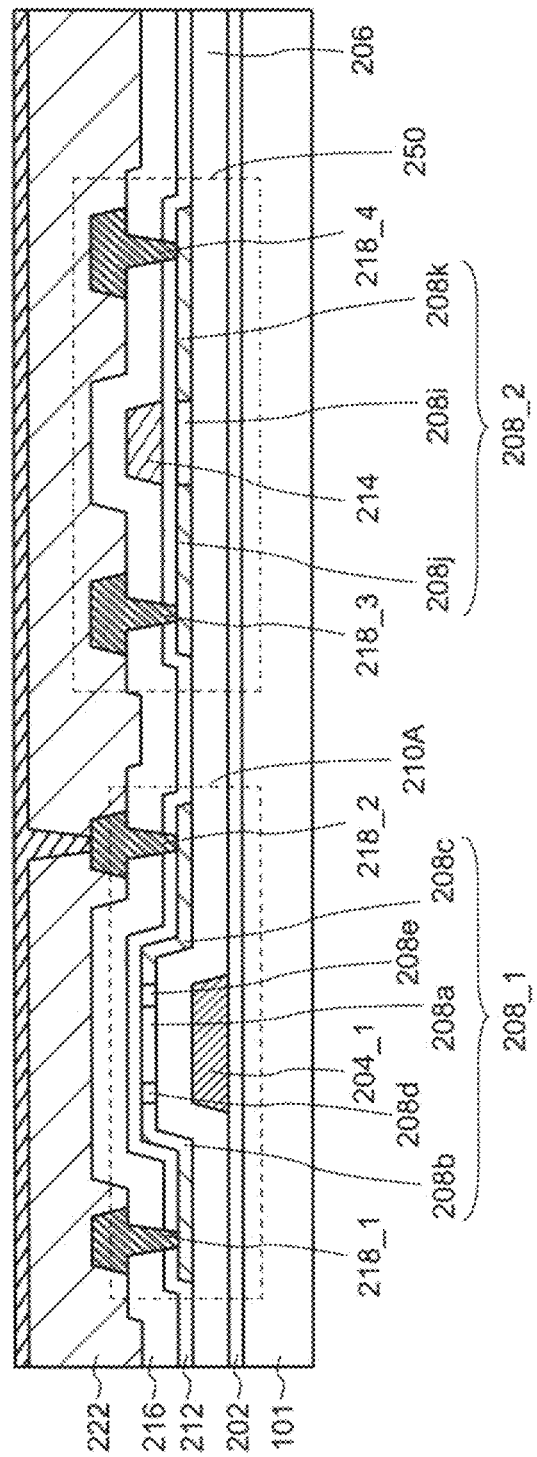
FIG. 14 is a cross-sectional view illustrating a manufacturing method of a display device according to an embodiment of the present invention.

FIG. 14 is a diagram illustrating a process of forming the insulating film 116 to the process of forming the pixel electrode 226. The process of forming the pixel electrode 226 from the process of forming the insulating film 216 may be described with reference to FIG. 8. In addition, the manufacturing methods described in the first embodiment may be applied from the step of forming the insulating layer 228 to the step of forming the inorganic insulating layer 242.

Through the above steps, the display device 100 having the structure of the pixel 103B shown in FIG. 11 can be manufactured.

According to the manufacturing process of the display device 100 according to an embodiment of the present invention, it is possible to easily form two types of transistors that are different in properties and structures without increasing the number of processes even in a small area within one pixel. In particular, the oxide semiconductor layer 208_1 including the high concentration impurity areas 208b and 208c and the low concentration impurity areas 208d and 208e and the oxide semiconductor layer 208_2 including the high concentration impurity areas 208g and 208h can be simultaneously formed.

Modification 2

Figure 15:
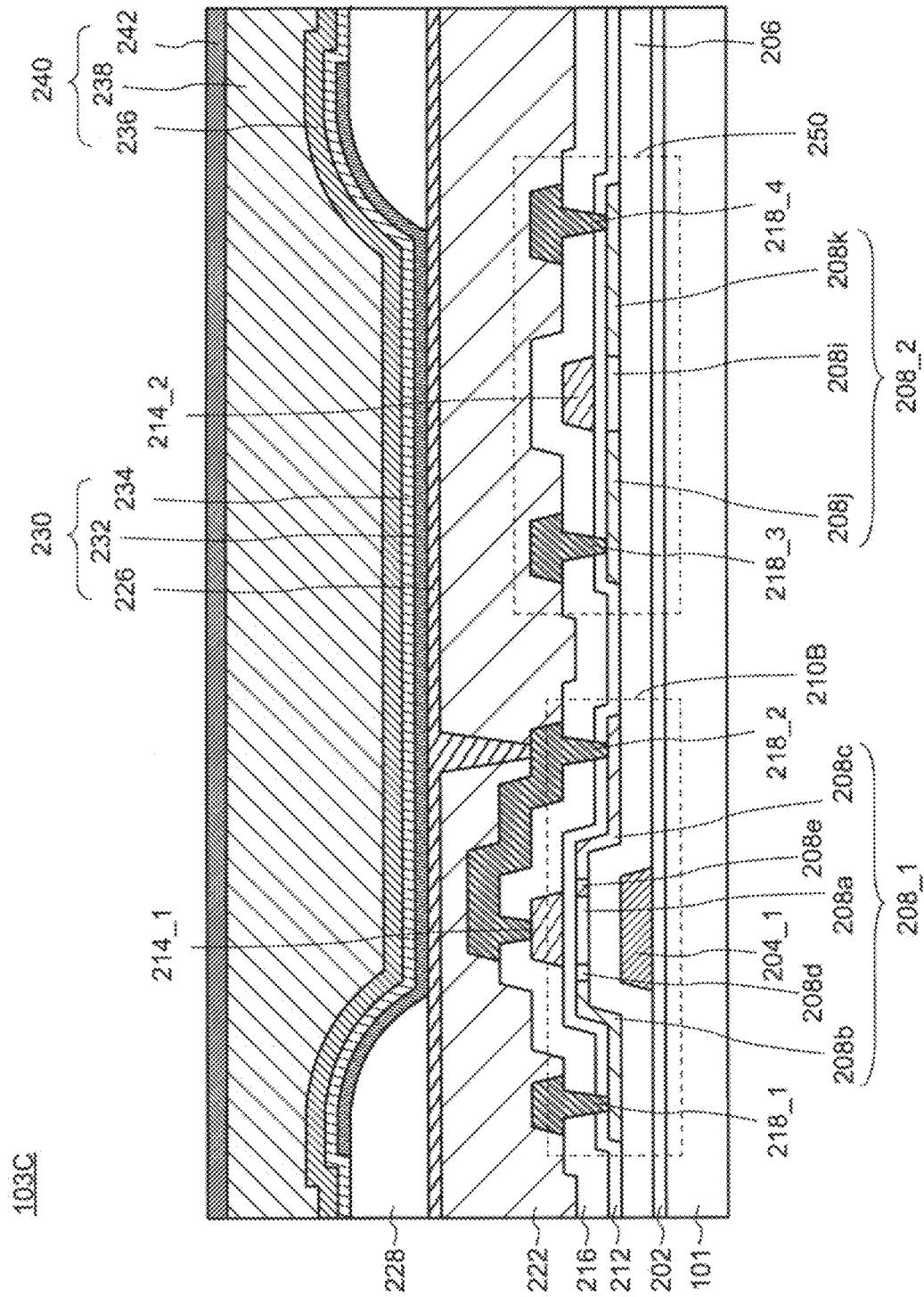
FIG. 15 is a diagram illustrating a cross-sectional structure of a pixel of a display device according to an embodiment of the present invention.

FIG. 15 is a diagram illustrating a cross-sectional structure of a pixel 103C of the display device 100 according to an embodiment of the present invention. As shown in FIG. 15, a transistor 210B and the transistor 250 are arranged on the substrate 101 via the base film 202. In this case, the transistor 250 corresponds to the writing transistor SST shown in FIG. 10, and the transistor 210B corresponds to the driving transistor DRT shown in FIG. 10.

In the transistor 210B, in the structure of the transistor 210A, the conductive layer 214_1 and the high concentration impurity area 208b are connected to each other via the source electrode or drain electrode 218_2. In the case where the transistor 210B is formed, after the conductive layers 214_1 and 214_2 are formed, impurity elements are added at a concentration of about $5\times10^{12}$ atoms/cm$^2$ to $1\times10^{14}$ atoms/cm$^2$ using the conductive layers 214_1 and 214_2 as masks. After that, a resist mask is formed so as to cover the conductive layer 214_1 and the low concentration impurity areas 208d and 208e, and then the impurity element is added at a concentration of about $1\times10^{14}$ atoms/cm$^2$ to $5\times10^{13}$ atoms/cm$^2$. Therefore, the channel area 208a, the high concentration impurity areas 208b and 208c, and the low concentration impurity areas 208d and 208e may be formed in the oxide semiconductor layer 208_1 included in the driving transistor DRT.

Third Embodiment

Figure 16:
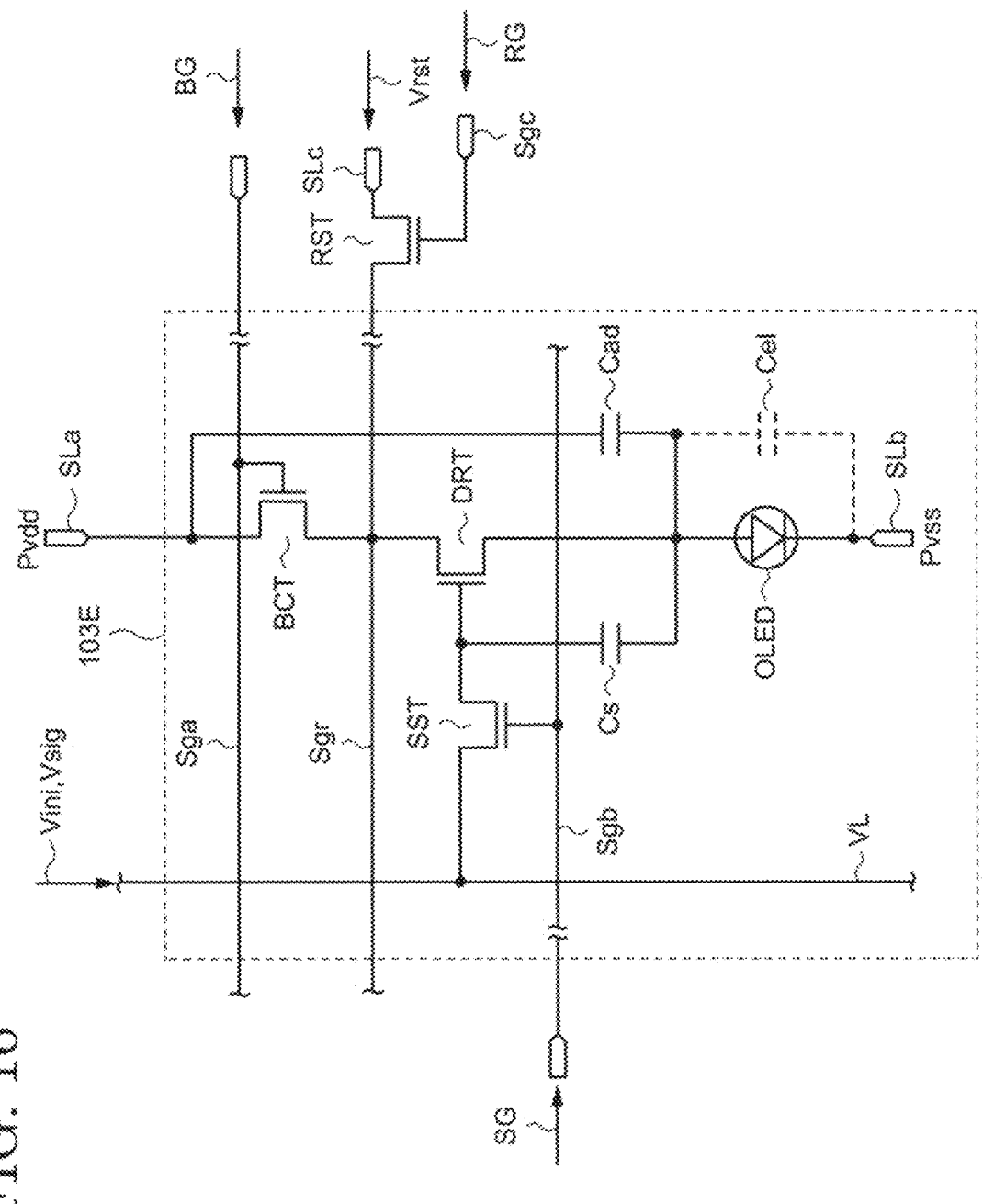
FIG. 16 is an equivalent circuit diagram of a pixel included in a display device according to an embodiment of the present invention.

In the present embodiment, the circuit structure of the pixels included in the display device 100 and operation methods will be described with reference to FIG. 16 and FIG. 17.
<Equivalent Circuit Diagram>
FIG. 16 is an equivalent circuit diagram of a pixel 103E of the display device 100 according to an embodiment of the present invention. The display device 100 includes the high potential power source Sla, the low potential power source electrode SLb, a light emission control scanning line Sga, a write control scanning line Sgb, a reset control scanning line Sgc, and the video signal line VL. The high potential power source Pvdd is applied to the high potential power source SLa, and the low potential power source Pvss is applied to the low potential power source electrode SLb. The light emission control scanning line Sga, the write control scanning line Sgb, and the reset control scanning line Sgc are connected to the gate driving circuits 104_1 and 104_2. In addition, the video signal line VL is connected to the driver IC 105.

The pixel 103E includes the writing transistor SST, the driving transistor DRT, the holding capacity Cs, and an additional capacity Cad. The holding capacity Cs and the additional capacity Cad are capacitors. The additional capacity Cad is an element arranged to adjust the amount of light emission current, and may be unnecessary in some cases. A parasitic capacitance Cel is the capacitance of the light-emitting element itself (parasitic capacitance of the light-emitting element OLED). The light-emitting element OLED also functions as a capacitor.

The pixel 103E includes an output transistor BCT. In the present embodiment, the four pixels 103E adjacent to each other in the row direction X and the column direction Y share one output transistor BCT. In addition, a plurality of reset transistors RST is arranged in the gate driving circuits 104_1 and 104_2. The reset transistor RST and the reset control scanning line Sgr are connected in a one-to-one manner.

The driving transistor DRT has the structure of the transistor 210 shown in the first embodiment, and the writing transistor SST, the output transistor BCT, and the reset transistor RST have the structure of the transistor 220 shown in the first embodiment. Alternatively, the driving transistor DRT may have the structure of the transistor 210A or the transistor 210B described in the second embodiment, and the writing transistor SST, the output transistor BCT, and the reset transistor RST may have the structure of the transistor 220 or the transistor 250 described in the second embodiment. In the display device 100 according to the present embodiment, all of the driving transistors and the transistors constituting the switches are formed in the same process.

Each of the writing transistor SST, the driving transistor DRT, the output transistor BCT, and the reset transistor RST includes a first terminal, a second terminal, and a control terminal. In the present embodiment, the first terminal is used as a source electrode, the second terminal is used as a drain electrode, and the control terminal is used as a gate electrode.

In the pixel circuit of the pixel, the driving transistor DRT is connected in series with the light-emitting element OLED between the high potential power source Sla and the low potential power source electrode SLb.

In the output transistor BCT, the drain electrode is connected to the high potential power source Sla, the source electrode is connected to the drain electrode of the driving transistor DRT, and the gate electrode is connected to the light emission control scanning line Sga. As a result, the output transistor BCT is turned on (conduction state) and off (non-conduction state) by a control signal BG (1 to m/2) from the light emission control scanning line Sga. The output transistor BCT controls the signal BG to control the light emission duration of the light-emitting element OLED.

In the driving transistor DRT, the drain electrode is connected to the source electrode of the output transistor BCT and the reset control scanning line Sgr, and the source electrode is connected to one electrode (in this case, the anode) of the light-emitting element OLED. The other electrode (in this case, the cathode) of the light-emitting element OLED is connected to the low potential power source electrode SLb. The driving transistor DRT outputs a driving current of a current amount corresponding to the video signal Vsig to the light-emitting element OLED.

In the writing transistor SST, the source electrode is connected to the video signal line VL (1 to n), the drain electrode is connected to the gate electrode of the driving transistor DRT, and the gate electrode is connected to the write control scanning line Sgb (1 to m) which functions as a gate wiring for signal write control. The writing transistor SST is turned on/off by the control signal SG (1 to m) supplied from the write control scanning line Sgb. According to the control signal SG (1 to m), the writing transistor SST controls the connection and disconnection between the pixel circuit and the video signal line VL (1 to n), and takes the video signal Vsig from the corresponding video signal line VL (1 to n) into the pixel circuit.

The reset transistor RST is arranged in the gate driving circuits 104_1 and 104_2 for every two rows. The reset transistor RST is connected between the drain electrode of the driving transistor DRT and a reset power source. In the reset transistor RST, the source electrode is connected to a reset power source line SLc connected to the reset power source, the drain electrode is connected to the reset control scanning line Sgr, and the gate electrode is connected to the reset control scanning line Sgc functioning as a gate wiring for reset control. As described above, the reset power source line SLc is connected to the reset power source and is fixed to a reset potential Vrst, which is a constant potential.

The reset transistor RST switches between a conductive state (on) and a non-conductive state (off) between the reset power source line SLc and the reset control scanning line Sgr according to a control signal RG (1 to m/2) supplied through the reset control scanning line Sgc. When the reset transistor RST is switched to the on-state, the potential of the source electrode of the driving transistor DRT is initialized.

The gate driving circuits 104_1 and 104_2 include a shift register, an output buffer, and the like (not shown), and sequentially transfer a horizontal scanning start pulse supplied from the outside to the next stage, and supply three types of control signals: the control signal BG (1 to m/2), the control signal SG (1 to m), and the control signal RG (1 to m/2) to the pixel 103E of each row via the output buffer. In addition, although the control signal RG is not directly supplied to the pixel 103E, a predetermined voltage is supplied from the reset power source line SLc fixed to the reset potential Vrst at a predetermined timing corresponding to the control signal RG. As a result, the light emission control scanning line Sga, the write control scanning line Sgb, and the reset control scanning line Sgc are respectively driven by the control signals BG, SG, and RG.

<Timing Chart>

Figure 17:
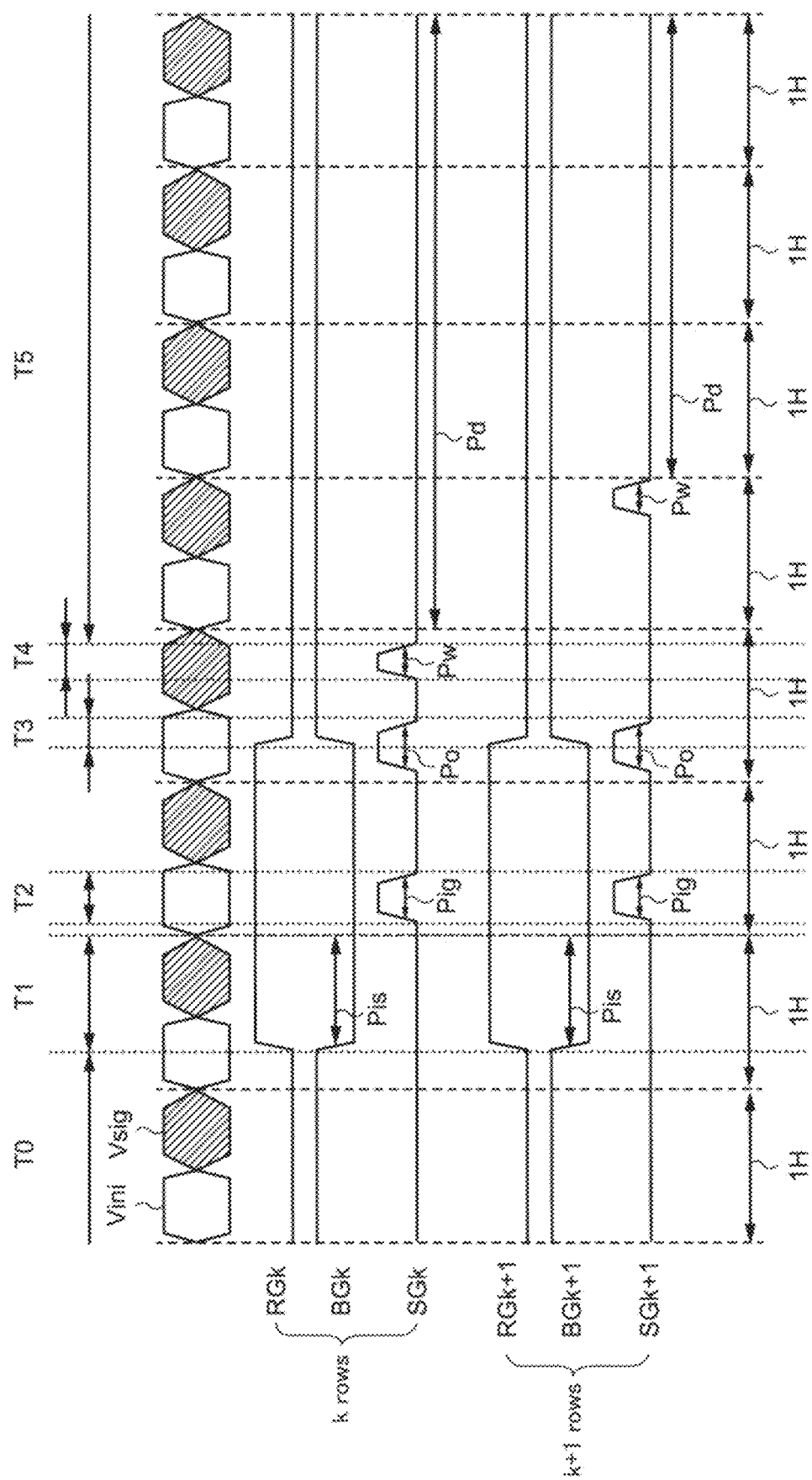
FIG. 17 is a timing chart of a pixel circuit shown in FIG. 16.

FIG. 17 is a timing chart of the gate driving circuits 104_1 and 104_2 for driving the pixels shown in FIG. 16. In FIG. 17, k rows of control signal RGk, control signal BGk, and control signal SGk are shown, and k+1 rows of control signal RGk+1, control signal BGk+1, and control signal SGk+1 are shown. Each section indicated by G1 to G4 is one horizontal period, which continues until the last row, although the rest is omitted. The periods indicated by T0~ in FIG. 16 will be described in detail below.

<T0. Previous Frame Light Emission>

The pixel continues to the light emission state in the previous frame until processing in a certain frame period is started.

<T1. DRT Source Initialization Operation>

In this period, first, the control signal BG is at the L level, the control signal RG is at the H level, and the control signal SG is at the L level, the output transistor BCT is turned off, the reset transistor RST is turned on, and the writing transistor SST is turned off. In this case, the holding capacity Cs holds "a voltage corresponding to the video signal written in the previous frame". When the video signal Vsig is larger than the reset potential Vrst, the source side also approaches the reset potential Vrst through the driving transistor DRT. In addition, since the reset potential Vrst has approximately the same potential as the low potential power source Pvss, the current supplied to the light-emitting element OLED is stopped. As a result, the potential of the driving transistor DRT is the lowest in the pixel system.

<T2. DRT Gate Initialization>

In this period, the control signal BG is at the L level, the control signal RG is at the H level, the control signal SG is at the H level, the video signal line VL is at an initialization potential Vini, the output transistor BCT is turned off, the reset transistor RST is turned on, and the writing transistor SST is turned on. In each pixel 103E in each row, the gate of the driving transistor DRT is fixed to the initialization potential Vini via the writing transistor SST. The initialization potential Vini is set to a potential larger than a threshold value of the driving transistor DRT with respect to the reset potential Vrst. That is, the driving transistor DRT is turned on by this operation. However, since the output transistor BCT is in the off-state, no current flows through the driving transistor DRT. In addition, in T1. DRT source initialization operation, even if the video signal Vsig is not larger than the reset potential Vrst, the source of the driving transistor DRT can also be initialized in this period.

<T3. Offset Cancel Operation>

In this period, the control signal BG is at the H level, the control signal RG is at the L level, the control signal SG is at the H level, the video signal line VL is at the initialization potential Vini, the output transistor BCT is turned on, the reset transistor RST is turned off, and the writing transistor SST is turned on. Since the driving transistor DRT is turned on by the previous operation, a current is supplied to the driving transistor DRT from the high potential Pvdd through the output transistor BCT. At this stage, no current flows because the voltage between the anode and cathode of the light-emitting element OLED does not exceed the light emission start voltage. Therefore, the source of the driving transistor DRT is charged by the current supplied from the high potential power source Pvdd, and its potential rises. In this case, a gate potential of the driving transistor DRT is Vini, so that the driving transistor DRT is turned off at a stage when the source of the driving transistor DRT is (Vini-Vth), and the increase of the potential is stopped. Vth is a threshold voltage of the driving transistor DRT, and the potential of the source of the driving transistor DRT when the increase of the potential is stopped varies depending on the pixel 103E. That is, according to the present operation, a voltage corresponding to the threshold voltage of the driving transistor DRT is acquired in each pixel 103E. In this case, although a voltage of {(Vini-Vth)-Pvss} is applied between the anode and cathode of the light-emitting element OLED, this voltage does not exceed the light emission start voltage, so no current flows through the light-emitting element OLED.

In addition, according to the timing chart of FIG. 17, although the operations of 1 to 3 are executed in parallel for 2 rows, it is not limited to this. The operations may be performed sequentially for one row, or in parallel for three or more rows.

<T4. Mobility Cancellation and Video Signal Write Operation>

The control signal BG is at the H level, the control signal RG is at the L level, the control signal SG is at the H level, the video signal line VL is at the video signal Vsig, the output transistor BCT is turned on, the reset transistor RST is turned off, and the writing transistor SST is turned on. In each pixel 103E of the row, the video signal Vsig is input to the gate of the driving transistor DRT, and the gate potential of the driving transistor DRT changes from the initialization potential Vini to the video signal Vsig. On the other hand, the source potential of the driving transistor DRT is still (Vini-Vth). As a result, the gate-source voltage of the driving transistor DRT becomes {Vsig-(Vini-Vth)}, which reflects variations in the threshold value between the pixels 103E.

Since the video signal line VL sharing the video signal Vsig is the same in the pixel 103E of a plurality of rows belonging to the same column, the video signal write operation is sequentially performed for each row.

<T5. Light-emitting Operation>

The Control signal BG is at the H level, the control signal RG is at the L level, the control signal SG is at the L level, the output transistor BCT is turned on, the reset transistor RST is turned off, and the writing transistor SST is turned off. A current is supplied from the high potential power source Pvdd to the driving transistor DRT through the output transistor BCT. The driving transistor DRT supplies a current corresponding to the gate-source voltage set up to the previous stage to the light-emitting element OLED, and the light-emitting element OLED emits light with a brightness corresponding to the current. Since the anode-cathode voltage of the light-emitting element OLED at this time becomes a voltage corresponding to the current, the potential on the anode side rises, but the gate-source voltage of the driving transistor DRT is held by the holding capacity Cs, so that the gate potential of the driving transistor DRT also rises due to the coupling of the holding capacity Cs as the potential on the anode side rises. In practice, the increase of the gate potential of the driving transistor DRT is slightly lower than the potential increase on the anode side because not only the holding capacity Cs but also the additional capacity Cad and other parasitic capacitances are attached to the gate of the driving transistor DRT. However, since this value is known, the potential of the video signal Vsig may be determined so as to have a desired current value at the gate-source voltage of the final driving transistor DRT.

In this way, a series of operations of the pixel is completed. When the operation is completed from the first row to the last row, one picture is displayed within one frame period. Thereafter, the operation is repeated to display an image.

Any one of the bottom-gate driving transistors 210, 210A, and 210B described in the first and second embodiments is applied to the driving transistor DRT. In addition, any of the top gate-driving transistors 220 and 250 described in the first and second embodiments is applied to the writing transistor SST, the reset transistor RST, an initialization transistor IST, and the like. As a result, since the S value of the driving transistor DRT is large, the change in the current of the driving transistor DRT can be reduced in the low gradation area that needs to be controlled with a minute current, and the gradation can be finely controlled. As a result, it is possible to suppress display unevenness in the display area 102.

Fourth Embodiment

In the present embodiment, the circuit structure of a pixel 103F included in the display device 100 and operation methods will be described with reference to FIG. 18 and FIG. 19.

<Circuit Diagram>

Figure 18:
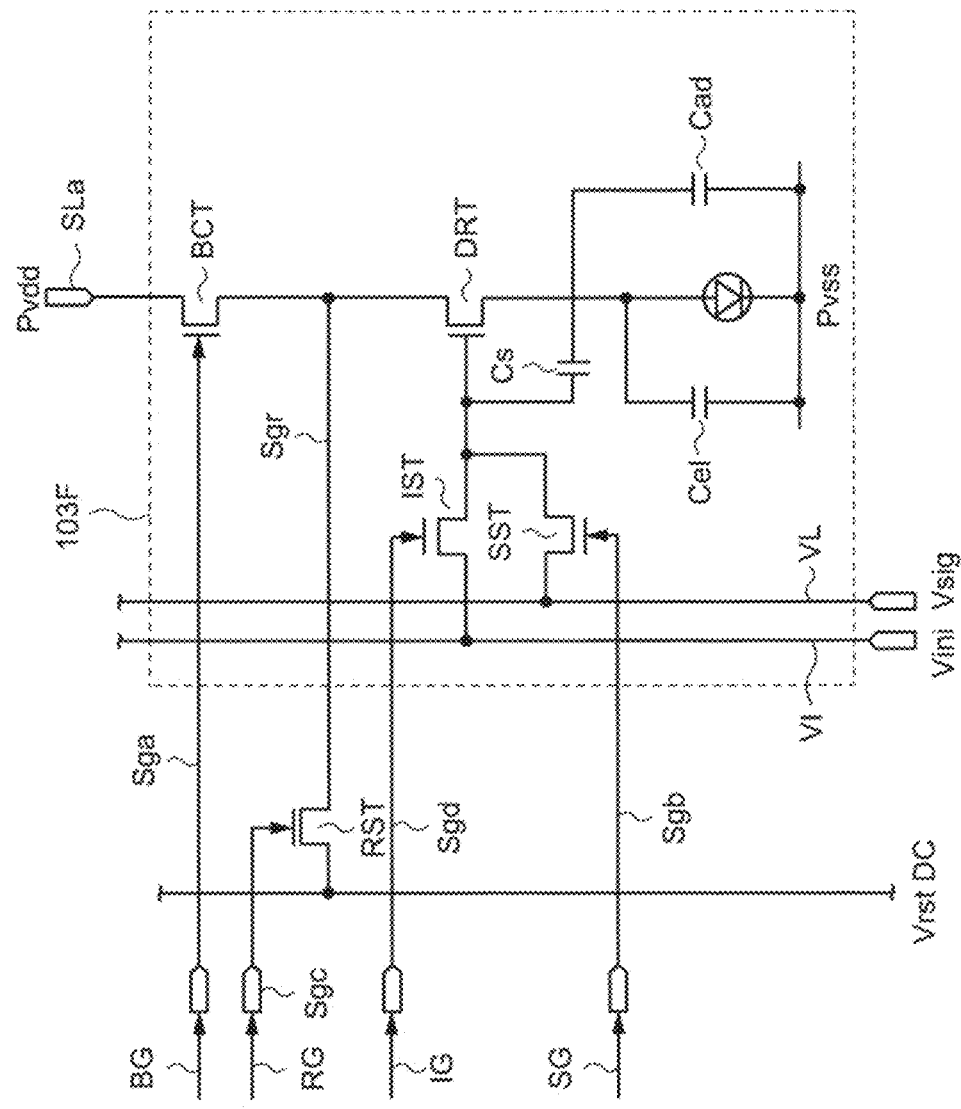
FIG. 18 is an equivalent circuit diagram of a pixel included in a display device according to an embodiment of the present invention.

FIG. 18 is an equivalent circuit diagram of the pixel circuit of the pixel 103F. The light emission control scanning line Sga, the write control scanning line Sgb, the reset control scanning line Sgc, and an initialization control scanning line Sgd are connected to the gate driving circuits 104_1 and 104_2 arranged on the outer side of the display area 102, respectively. The output transistor BCT, the initialization transistor IST, the writing transistor SST, and the driving transistor DRT are arranged in each pixel 103F. Some transistors may be shared between the plurality of adjacent pixels 103F. The reset transistor RST is arranged on the outer side of the display area, for example, one in each row. The holding capacity Cs may be arranged between the gate-source of the driving transistor DRT. The parasitic capacitance Cel is the parasitic capacitance between the anode-cathode of the light-emitting element OLED. The high potential power source Pvdd is applied to the anode of the light-emitting element OLED via the output transistor BCT and the driving transistor DRT, and the low potential power source Pvss is applied to the cathode. The output transistor BCT, the initialization transistor IST, and the writing transistor SST function as switching elements that select conduction and non-conduction between two nodes, and the driving transistor DRT functions as a current control element that controls the current flowing through the OLED according to the gate-source voltage. In the present embodiment, the transistor 210 is applied as the driving transistor DRT, and the transistor 220 is applied as the output transistor BCT, the initialization transistor IST, and the writing transistor SST.

<Timing Chart>

Figure 19:
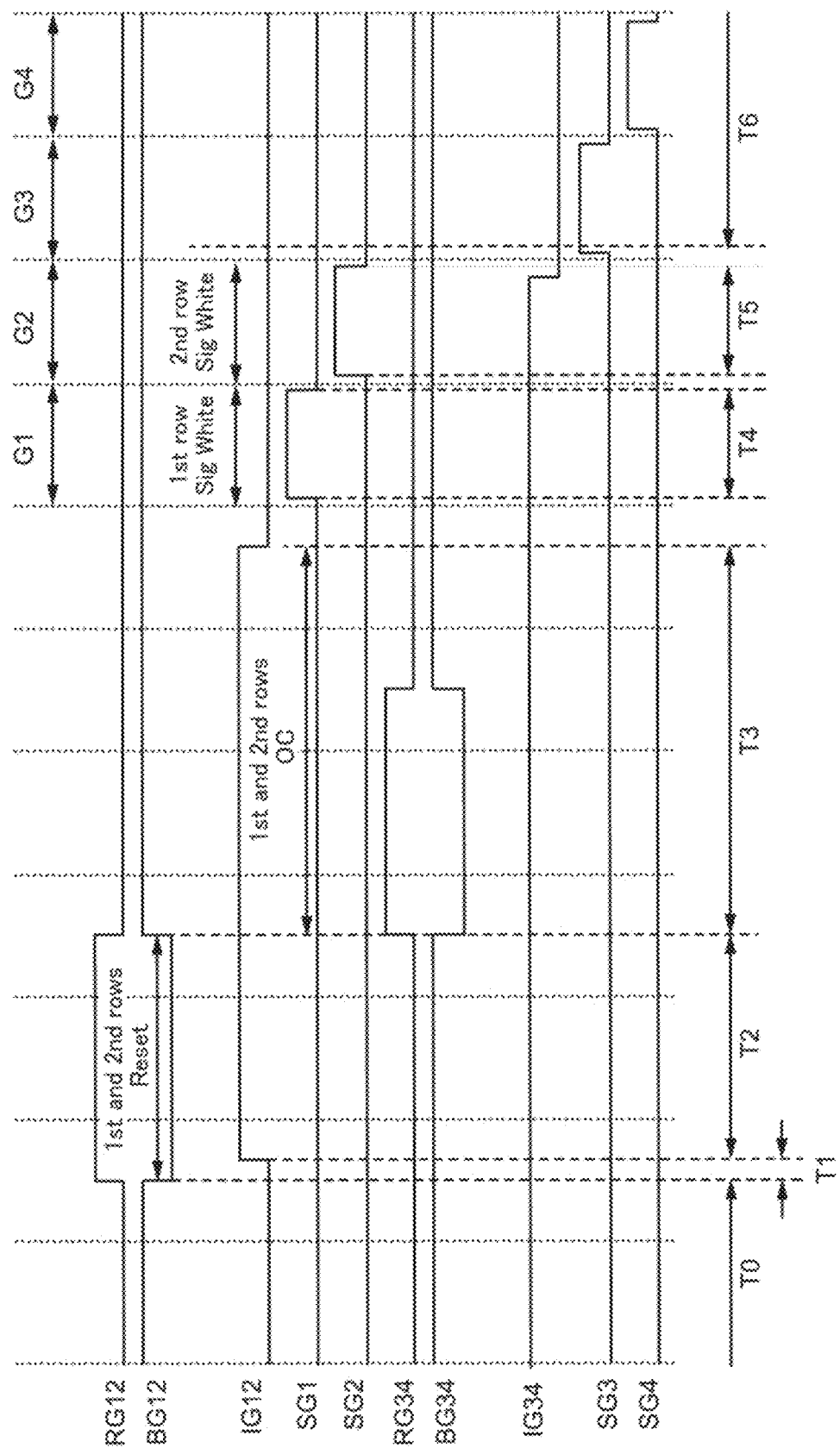
FIG. 19 is a timing chart of a pixel circuit shown in FIG. 18.

FIG. 19 is a timing chart of the gate driving circuits 104_1 and 104_2 for driving the pixels shown in FIG. 18. Each section indicated by G1 to G3 is one horizontal period, which continues until the last row. The period indicated by T0 to T6 in FIG. 19 will be described below.

<T0. Previous Frame Light Emission>

The pixel continues to emit light in the previous frame until processing in a certain frame period is started.

<T1. Source Initialization Operation of Driving Transistor DRT>

In this period, first, the control signal BG is at the L level, the control signal RG is at the H level, a control signal IG is at the L level, and the control signal SG is at the L level, the output transistor BCT is turned off, the reset transistor RST is turned on, the initialization transistor IST is turned off, and the writing transistor SST is turned off. In this case, the holding capacity Cs holds "a voltage corresponding to the video signal written in the previous frame". When the video signal Vsig is larger than the reset potential Vrst, the source side also approaches the reset potential Vrst through the driving transistor DRT. In addition, since the reset potential Vrst has approximately the same potential as the low potential power source Pvss, the current supplied to the light-emitting element OLED is stopped. As a result, the potential of the driving transistor DRT is the lowest in the pixel system.

<T2. Gate Initialization of Driving Transistor DRT>

The control signal IG is at the H level and the initialization transistor IST is turned on. In each pixel of the row, the gate of the driving transistor DRT is fixed to the initialization potential Vini via the initialization transistor IST. The initialization potential Vini is set to a potential larger than a threshold value of the driving transistor DRT with respect to the reset potential Vrst. That is, the driving transistor DRT is turned on by this operation. However, since the output transistor BCT is in the off-state, no current yet flows through the driving transistor DRT.

<T3. Offset Cancel Operation>

The control signal BG is at the H level, the control signal RG is at the L level, and the control signal IG is at the H level, the output transistor BCT is turned on, the reset transistor RST is turned off, and the initialization transistor IST is turned on. Since the driving transistor DRT is turned on by the previous operation, a current is supplied to the driving transistor DRT from the Pvdd through the output transistor BCT. At this stage, no current flows because the voltage between the anode and cathode of the light-emitting element OLED does not exceed the light emission start voltage. Therefore, the source of the driving transistor DRT is changed by the current supplied from the high potential power source Pvdd, and its potential rises. In this case, the gate potential of the driving transistor DRT is the initialization potential Vini, so that the driving transistor DRT is turned off at a stage when the source of the driving transistor DRT is (Vini-Vth), and the increase of the potential is stopped. Vth is a threshold voltage of the driving transistor DRT, and the potential of the source of the DRT when the increase of the potential is stopped varies depending on the pixel 103F. That is, according to the present operation, a voltage corresponding to the threshold voltage of the driving transistor DRT is acquired in each pixel. In this case, although a voltage of {(Vini-Vth)-Pvss} is applied between the anode and cathode of the light-emitting element OLED, this voltage does not exceed the light emission start voltage, so no current flows through the light-emitting element OLED.

In addition, according to the timing chart of FIG. 19, although the operations of T1 to T3 are executed in parallel for 2 rows, it is not limited to this. The operations may be performed sequentially for one row, or in parallel for three or more rows.

<T4. T5. Video Signal Write Operation>

The control signal BG is at the H level, the control signal RG is at the L level, the control signal IG is at the L level, and the control signal SG is at the H level, the output transistor BCT is turned on, the reset transistor RST is turned off, the initialization transistor IST is turned off, and the writing transistor SST is turned on. In each pixel of the row, the video signal Vsig is input to the gate of the driving transistor DRT, and the gate potential of the driving transistor DRT changes from Vini to Vsig. On the other hand, the source potential of the driving transistor DRT is still (Vini-Vth). As a result, the gate-source voltage of the driving transistor DRT becomes {Vsig-(Vini-Vth)}, which reflects variations in the threshold value between the pixels.

Since the video signal line VL sharing the Vsig is the same in the pixel of a plurality of rows belonging to the same column, the write operation of the video signal Vsig is sequentially performed for each row.

<T6. Light-Emitting Operation>

The control signal BG is at the H level, the control signal RG is at the L level, the control signal IG is at the L level, and the control signal SG is at the L level, the output transistor BCT is turned on, the reset transistor RST is turned off, the initialization transistor IST is turned off, and the writing transistor SST is turned off. A current is supplied from the high potential power source Pvdd to the driving transistor DRT through the output transistor BCT. The driving transistor DRT supplies a current corresponding to the gate-source voltage set up to the previous stage to the light-emitting element OLED, and the light-emitting element OLED emits light with a brightness corresponding to the current. Since the anode-cathode voltage of the light-emitting element OLED at this time becomes a voltage corresponding to the current, the potential on the anode side rises, but the gate-source voltage of the driving transistor DRT is held by the holding capacity Cs, so that the gate potential of the driving transistor DRT also rises due to the coupling of the holding capacity Cs as the potential on the anode side rises. In practice, the increase of the gate potential of the driving transistor DRT is slightly lower than the potential increase on the anode side since not only the holding capacity Cs but also the additional capacity Cad and other parasitic capacitance Cel are attached to the gate of the driving transistor DRT. However, since this value is known, the potential of the video signal Vsig may be determined so as to have a desired current value at the gate-source voltage of the final driving transistor DRT.

Therefore, a series of operations of the pixel 103F is completed. When the operation is completed from the first row to the last row, one picture is displayed within one frame period. Thereafter, the operation is repeated to display an image.

Any one of the bottom-gate driving transistors 210, 210A, and 210B described in the first and second embodiments is applied to the driving transistor DRT. In addition, any of the top gate-driving transistors 220 and 250 described in the first and second embodiments is applied to the writing transistor SST, the reset transistor RST, the initialization transistor IST, and the like. As a result, since the S value of the driving transistor DRT is large, the change in the current of the driving transistor DRT can be reduced in the low gradation area that needs to be controlled with a minute current, and the gradation can be finely controlled. As a result, it is possible to suppress display unevenness in the display area 102.

EXAMPLES

In the present EXAMPLES, a transistor of a dual gate type bottom gate driving transistor, a transistor of a dual gate type top gate driving transistor, and a top gate type transistor are formed on the same substrate, and evaluation results of the characteristics of each transistor will be described.

Figure 20:
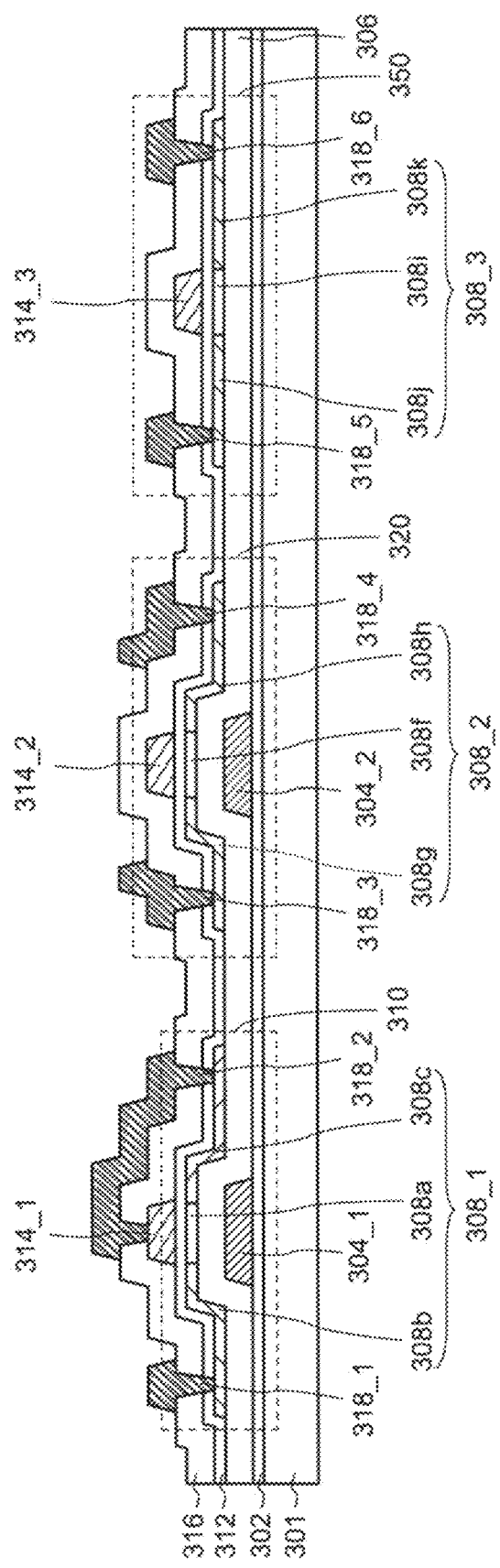
FIG. 20 is a diagram illustrating a cross-sectional structure of a transistor according to an example.

Manufacturing methods of a dual gate type bottom gate driving transistor 310, a dual gate type top gate driving transistor 320, and a top gate type transistor 350 prepared in the present EXAMPLES will be described with reference to FIG. 20.

First, a base film 302 was formed on a substrate 301 using a single layer of silicon oxide or silicon nitride or a stacked layer thereof. Next, conductive layers 304_1 and 304_2 were formed on the base film 302 using aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), or bismuth (Bi). Next, an insulating film 306 was formed on the conductive layers 304_1 and 304_2 using a single layer of silicon oxide or silicon nitride or a stacked layer thereof. For example, a thickness of the insulating film 306 is preferably 250 nm or more and 500 nm or less. Next, oxide semiconductor layers 308_1 to 308_3 were formed on the insulating film 306. For example, the oxide semiconductor film is preferably formed to have a thickness of 30 nm or more and 100 nm or less by a sputtering method. Next, an insulating film 312 was formed on the oxide semiconductor layers 308_1 to 308_3 using a single layer of silicon oxide or silicon nitride or a stacked layer thereof. For example, the thickness of the insulating film 312 is preferably 100 nm or more and 200 nm or less. Next, conductive layers 314_1 to 314_3 were formed. Next, impurity elements were added at a concentration of $1\times10^{14}$ atoms/cm$^2$ to $5\times10^{15}$ atoms/cm$^2$ by ion-implantation using the conductive layers 314_1 to 314_3 as masks. The impurity element may be hydrogen, argon, phosphorus, boron, or the like. As a result, a channel area 308$a$ and high concentration impurity areas 308$b$ and 308$c$ are formed in the oxide semiconductor layer 308_1. A channel area 308$f$ and high concentration impurity areas 308$g$ and 308$h$ are formed in an oxide semiconductor layers 308_2. A channel area 308$i$ and high concentration impurity areas 308$j$, 308$k$ are formed in the oxide semiconductor layers 308_3. Next, an insulating film 316 was formed on the conductive layers 314_1 to 314_3 using a single layer of silicon oxide or silicon nitride or a stacked layer thereof. For example, a thickness of the insulating film 316 is preferably 250 nm or more and 500 nm or less. Contact holes reaching the oxide semiconductor layers 308_1 to 308_3 and the conductive layer 314_1 were formed in the insulating film 316. Finally, the source electrodes and the drain electrodes 318_1 to 318_6 were formed on the insulating film 316.

Through the above steps, the transistor 310, the transistor 320, and the transistor 350 having different gate insulating film thicknesses were simultaneously formed on the substrate 101. In the transistor 310, the conductive layer 314_1 functions as a gate electrode, in the transistor 320, the conductive layer 314_2 functions as a gate electrode, and in the transistor 350, the conductive layer 314_3 functions as a gate electrode. In this case, in each of the transistor 310, the transistor 320, and the transistor 350, the channel width is set to 3 μm and the channel length is set to 4 μm. The channel width and the channel length correspond to the width and the length of the area where the conductive layer functioning as the gate electrode and the oxide semiconductor layer are overlapped. In addition, twenty-eight transistors 310, 320, and 350 were formed on the same substrate, respectively.

Next, Id-Vg properties of the transistor 310, the transistor 320, and the transistor 350 were measured. Id-Vg properties were measured in 0.1 V steps from −5 V to +10 V as a gate voltage (Vg) applied to the gate electrode of each transistor. In addition, the source voltage (Vs) applied to the source electrode was set to 0 V, and the drain voltage (Vd) applied to the drain electrode was set to 0.1 V and 10 V. Further, in the transistor 320, a back gate voltage applied to the conductive layer 304_2 was set to 0 V.

Figure 21:
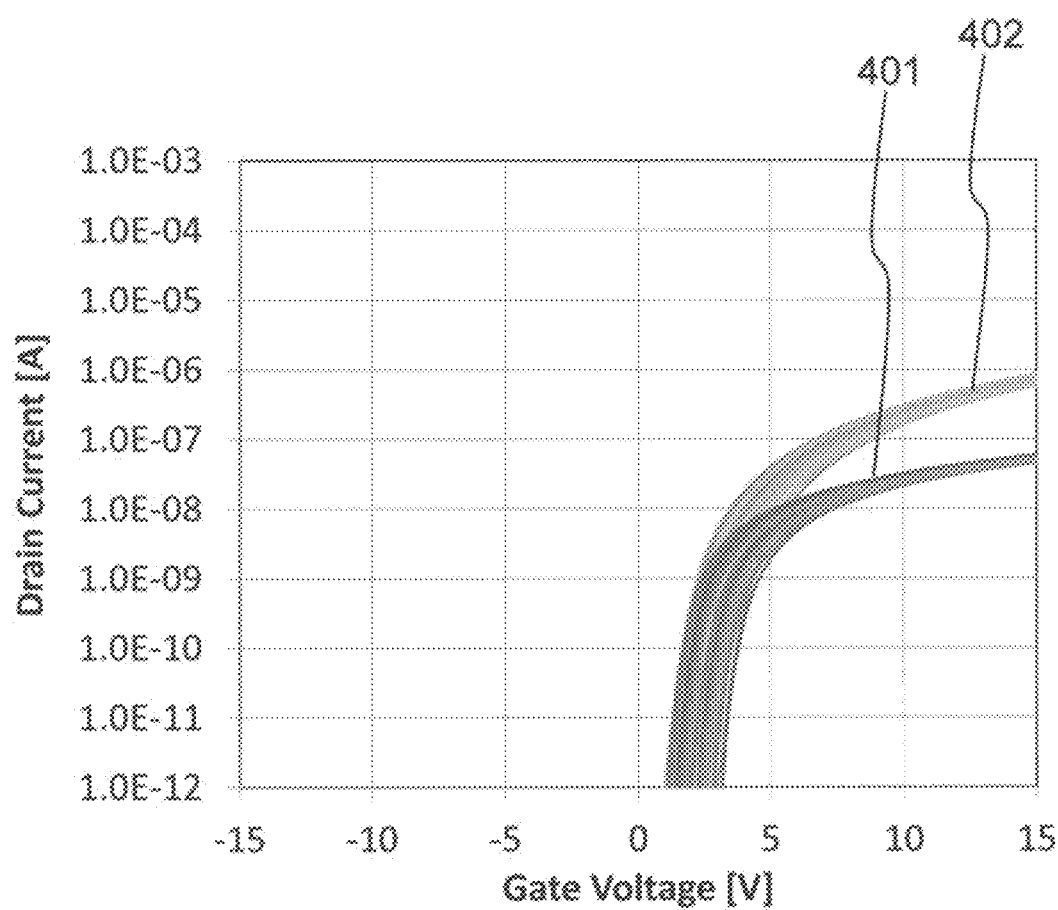
FIG. 21 is a diagram showing Id-Vg properties of a dual-gate type bottom gate driving transistor.
Figure 22:
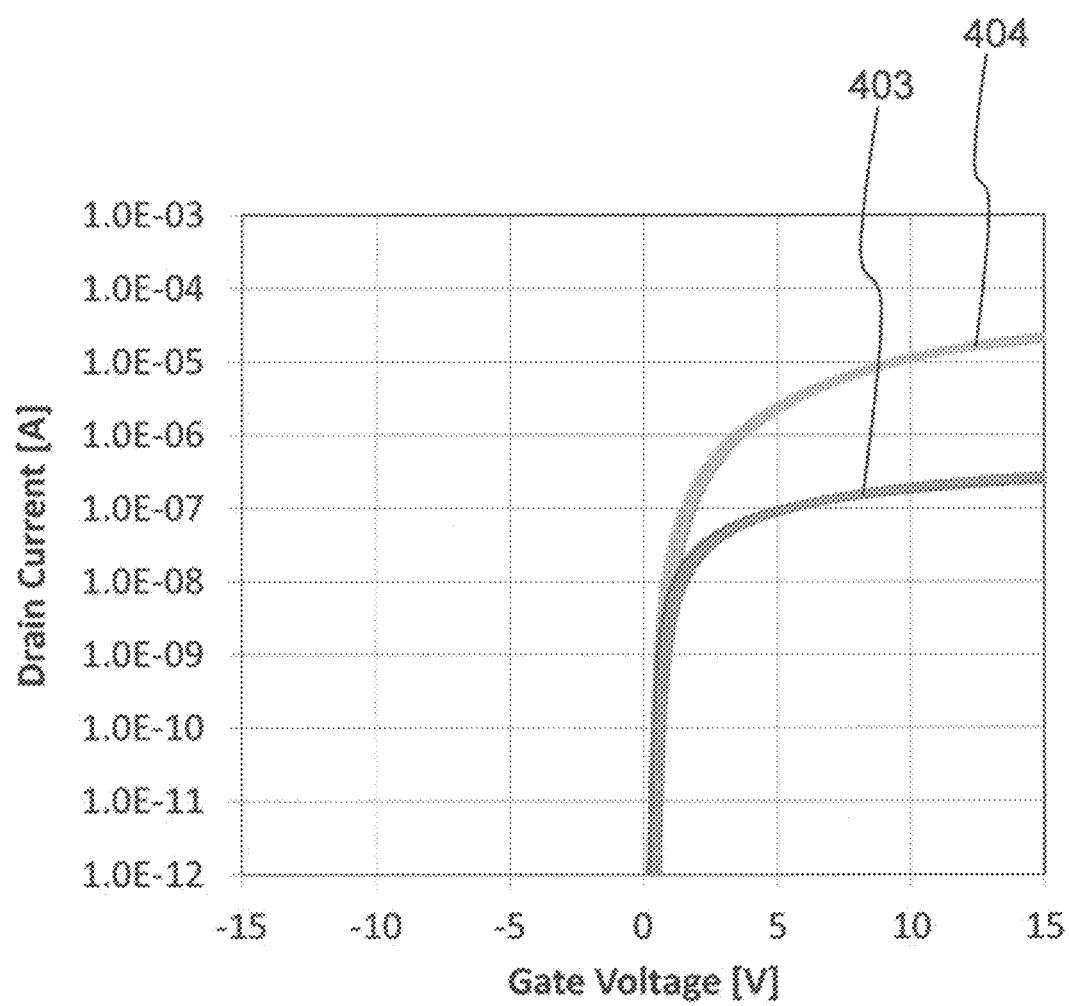
FIG. 22 is a diagram showing Id-Vg properties of a dual-gate type top gate drive.
Figure 23:
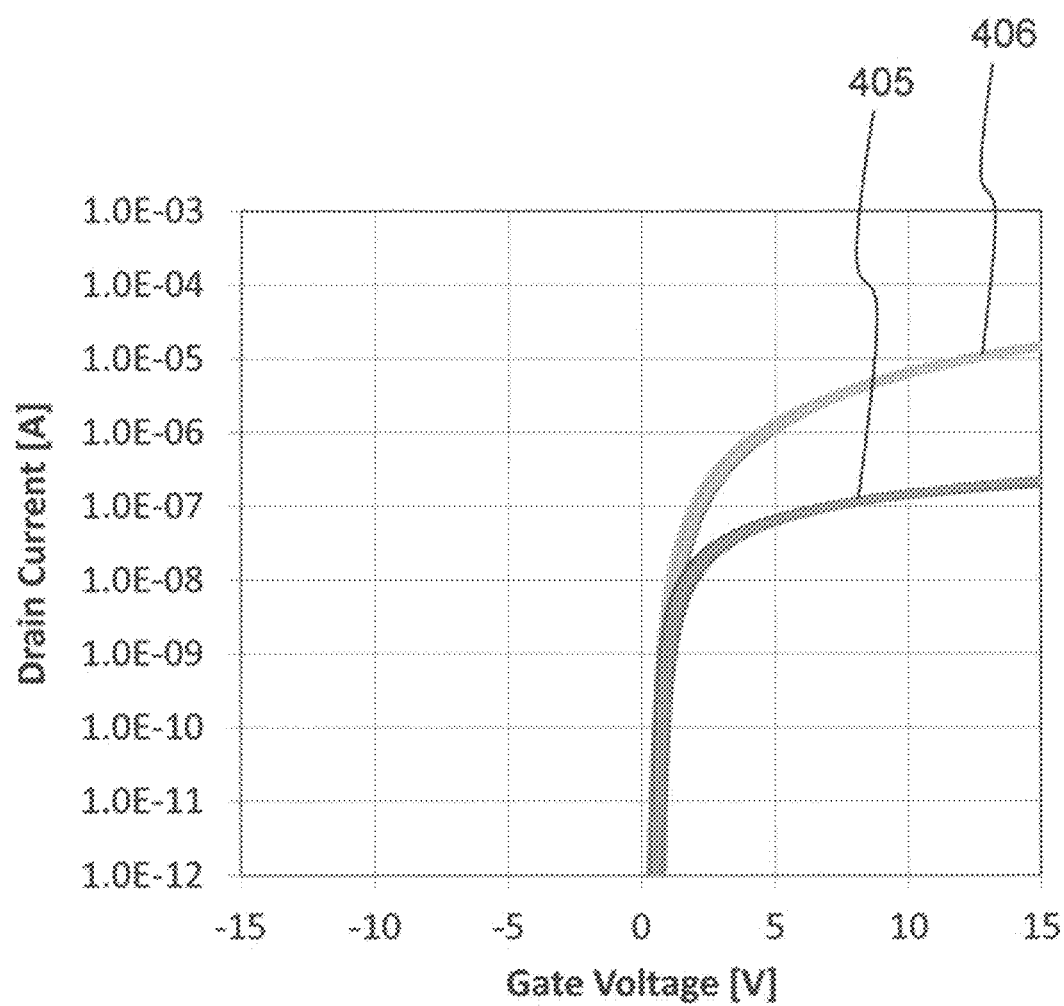
FIG. 23 is a diagram showing top gate type Id-Vg properties.

FIG. 21 is a graph of Id-Vg properties of the dual gate type bottom gate driving transistor 310. FIG. 22 is a graph of Id-Vg properties of the top gate type driving transistor 320. FIG. 23 is a graph of Id-Vg properties of the top gate type transistor 350. In addition, in FIG. 21 to FIG. 22, the vertical axis represents a drain current Id [A], and the horizontal axis represents a gate voltage Vg [V]. In FIG. 21, a solid line 401 is a graph of Id-Vg properties of Vd=0.1 V, and a solid line 402 is a graph of Id-Vg properties of Vd=10 V. In FIG. 22, a solid line 403 is a graph of Id-Vg properties of Vd=0.1 V, and a solid line 404 is a graph of Id-Vg properties of Vd=10 V. In FIG. 23, a solid line 405 is a graph of Id-Vg properties of Vd=0.1 V, and a solid line 406 is a graph of Id-Vg properties of Vd=10 V.

Tables 1 to 3 summarize the mobility μFE (Lin) [m$^2$/V·s] in linear areas, the mobility μFE (Sat) [m$^2$/V·s] in saturated areas, the threshold voltage Vth [V], and the subthreshold swing value S.S [V/decade] (S value) of the transistors 310, 320, and 350, respectively. Maximum (Max), average (ave.), minimum (min), and standard deviation (3σ) were calculated for the μFE (Sat), the threshold voltage Vth, and the subthreshold swing value S.S (S value), respectively.

TABLE 1

| Transistor 310 | | | | |
|---|---|---|---|---|
| | max | ave. | min | 3σ |
| μFE(Lin) [m$^2$/V · s] | 2.1 | 1.9 | 1.8 | 0.2 |
| μFE(Sat) [m$^2$/V · s] | 0.47 | 0.43 | 0.40 | 0.05 |
| Vth [V] | 4.42 | 3.39 | 2.27 | 1.75 |
| S.S. [V/decade] | 0.412 | 0.374 | 0.340 | 0.068 |

TABLE 2

| Transistor 320 | | | | |
|---|---|---|---|---|
| | max | ave. | min | 3σ |
| μFE(Lin) [m$^2$/V · s] | 8.8 | 8.2 | 7.4 | 1.0 |
| μFE(Sat) [m$^2$/V · s] | 11.1 | 10.3 | 9.50 | 1.20 |
| Vth [V] | 0.95 | 0.70 | 0.47 | 0.43 |
| S.S. [V/decade] | 0.115 | 0.091 | 0.068 | 0.040 |

TABLE 3

| Transistor 350 | | | | |
|---|---|---|---|---|
| | max | ave. | min | 3σ |
| μFE(Lin) [m$^2$/V · s] | 6.8 | 6.2 | 5.7 | 0.8 |
| μFE(Sat) [m$^2$/V · s] | 6.70 | 6.00 | 5.50 | 0.80 |
| Vth [V] | 1.23 | 0.88 | 0.62 | 0.49 |
| S.S. [V/decade] | 0.134 | 0.108 | 0.095 | 0.030 |

Table 1 to Table 3 show that the S values of the transistors 320 and 350 are smaller than the S value of the transistor 310. This is considered to be because the thickness of the insulating film 312 functioning as the gate insulating film of the transistors 320 and 350 is thinner than the thickness of the insulating film 306 functioning as the gate insulating film of the transistor 310.

On the other hand, it was shown that the mobility μFE (Lin) in the linear area of the transistor 320 and the transistor 350 and the mobility μFE (Sat) in the saturated area are larger than the mobility μFE (Lin) in the linear area and the mobility μFE (Sat) in the saturated area of the transistor 310. This is considered to be because the thickness of the insulating film 312 functioning as the gate insulating film of the transistor 320 and the transistor 350 is thinner than the thickness of the insulating film 306 functioning as the gate insulating film of the transistor 310.

Next, the results of a current stress test performed on the transistor 310 and the transistor 350 will be described.

In the constant current stress test, the test temperature was set to 35° C., the stress current was set to 160 nA, the drain voltage and the gate voltage were adjusted, and the current was continuously applied for 12 hours.

Figure 24:
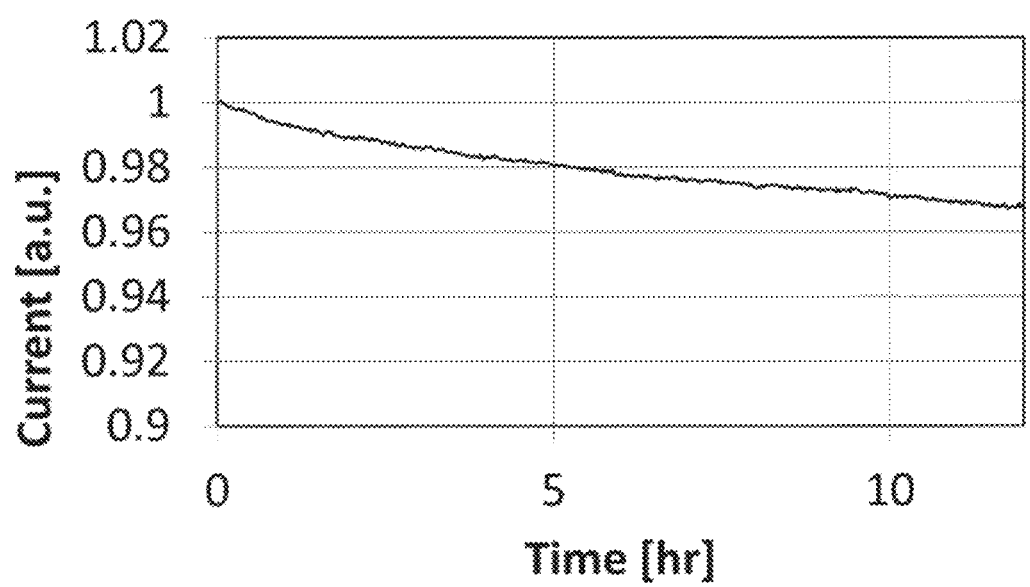
FIG. 24 is a diagram showing results of a constant current stress test of a dual-gate type top gate driving transistor.
Figure 25:
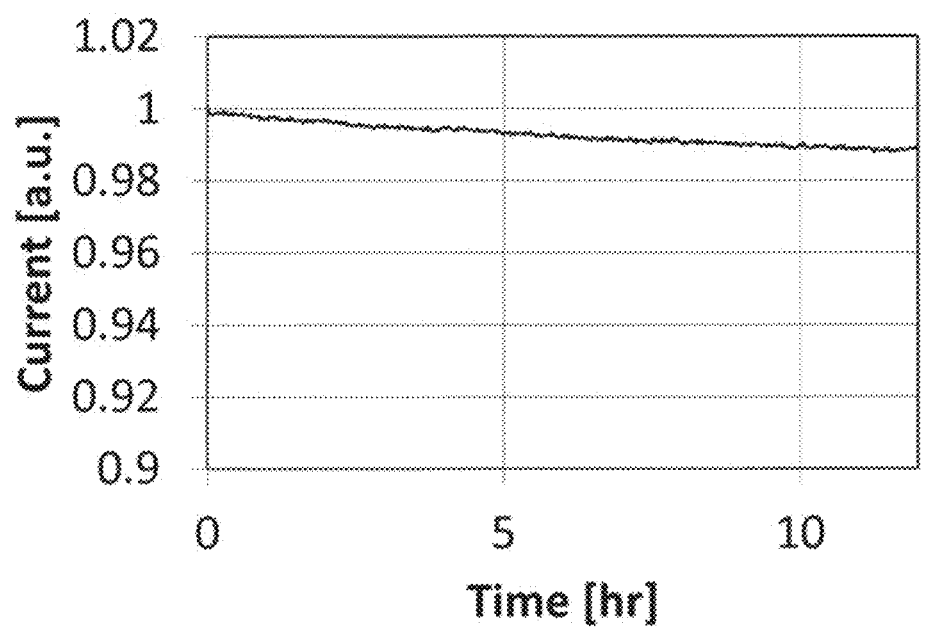
FIG. 25 is a diagram showing results of a constant current stress test of a dual-gate type bottom gate driving transistor.

FIG. 24 is a result of a constant current stress test of the transistor 350, and FIG. 25 is a result of a constant current stress test of the transistor 310. In addition, in FIG. 24 and FIG. 25, the vertical axis represents the degradation rate of the ON current (Ion) of the transistor, and the horizontal axis represents the stress duration.

As shown in FIG. 24, the deterioration rate of the transistor 350 after 10 hours was 1.9%, and as shown in FIG. 25, the deterioration rate of the transistor 310 after 10 hours was 1.0%. As shown in FIG. 24 and FIG. 25, it can be seen that both of the transistors 310 and 350 have high reliability. In particular, in the transistor 310, the degradation rate of the ON current after 10 hours is extremely small. The above results show that the transistor according to an embodiment of the present invention has high reliability.

The addition, deletion, or design change of components, or the addition, deletion, or condition change of processes as appropriate by those skilled in the art based on a display device described as the embodiments and examples of the present invention are also included in the scope of the present invention as long as they are provided with the gist of the present. The above-described embodiments can be combined with each other without causing any technical inconsistency.

Further, it is understood that, even if the effect is different from those provided by each of the above-described embodiments, the effect obvious from the description in the specification or easily predicted by persons ordinarily skilled in the art is apparently derived from the present invention.

Within the spirit of the present invention, it is understood that various modifications and changes can be made by those skilled in the art and that these modifications and changes also fall within the scope of the present invention. For example, the addition, deletion, or design change of components, or the addition, deletion, or condition change of processes as appropriate by those skilled in the art based on each embodiment are also included in the scope of the present invention as long as they are provided with the gist of the present invention.

What is claimed is:
1. A display device comprising:
   a substrate;
   a light-emitting element;
   a first transistor controlling a current value flowing from a driving power supply line to the light-emitting element; and
   a second transistor writing a voltage determining a luminance of the light-emitting element to a first gate electrode of the first transistor,
   the first transistor including:
   the first gate electrode arranged on the substrate;
   a first insulating film arranged on the first gate electrode;
   a first oxide semiconductor arranged on the first insulating film, and having an area overlapping the first gate electrode;

a second insulating film arranged on the first oxide semiconductor; and a first conductive layer arranged on the second insulating film, the second transistor including:

the first insulating film arranged on the substrate;

a second oxide semiconductor arranged on the first insulating film;

the second insulating film arranged on the first oxide semiconductor and the second oxide semiconductor, and having a thickness smaller than a thickness of the first insulating film;

a second gate electrode arranged on the second insulating film, and having an area overlapping the second oxide semiconductor, wherein the first oxide semiconductor includes a first channel region, a first high concentration impurity region, and a low concentration impurity region between the first channel region and the first high concentration impurity region, the low concentration impurity region is in contact with both of the first channel region and the first high concentration impurity region, the second oxide semiconductor includes a second channel region and a second high concentration impurity region in contact with the second channel region, the first conductive layer is electrically connected to the light-emitting element, the first high concentration impurity region and the second high concentration impurity region contain an impurity element at a concentration of about $5 \times 10^{13}$ atoms/cm$^3$ to $2.5 \times 10^{15}$ atoms/cm$^3$, and the low concentration impurity region contains the impurity element at a concentration of $2.5 \times 10^{12}$ atoms/cm$^3$ to $5 \times 10^{13}$ atoms/cm$^3$.

2. The display device according to claim 1, wherein the thickness of the first insulating film is 250 nm or more and 500 nm or less, and the thickness of the second insulating film is 100 nm or more and 200 nm or less.

3. The display device according to claim 1, wherein the second transistor further has a second conductive layer on the second insulating film, and the first gate electrode is electrically connected to the second conductive layer.

4. The display device according to claim 1, further comprising:

a third conductive layer between the substrate and the first insulating film, and overlapping the second oxide semiconductor and the second gate electrode.

5. The display device according to claim 1, further comprising:

a third transistor electrically connected to the driving power supply line, the third transistor including:

the first insulating film arranged on the substrate;

a third oxide semiconductor arranged on the first insulating film;

the second insulating film arranged on the third oxide semiconductor; and a third gate electrode arranged on the second insulating film, and having an area overlapping the third oxide semiconductor.

* * * * *